United States Patent
Zobenko et al.

(10) Patent No.: US 11,828,818 B2
(45) Date of Patent: Nov. 28, 2023

(54) METHOD CALIBRATING MAGNETOMETER AND MAGNETOMETER CALIBRATION DEVICE

(71) Applicant: SAMSUNG ELECTRONICS CO., LTD., Suwon-si (KR)

(72) Inventors: Andrey Zobenko, Suwon-si (KR); Gwon Sedo, Goyang-si (KR); Jungwoong Yoon, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/895,254

(22) Filed: Aug. 25, 2022

(65) Prior Publication Data

US 2023/0273273 A1    Aug. 31, 2023

(30) Foreign Application Priority Data

Nov. 12, 2021 (KR) .................. 10-2021-0155788
Feb. 14, 2022 (KR) .................. 10-2022-0018711

(51) Int. Cl.
*G01R 33/00* (2006.01)

(52) U.S. Cl.
CPC .................. *G01R 33/0035* (2013.01)

(58) Field of Classification Search
CPC ......... G01R 33/0035; G01R 33/0023; G01R 35/005; G01R 33/0017; G01R 33/028; G01R 33/04; G01R 1/0425; G01R 33/0029; G01R 33/02; G01R 33/022; G01R 33/032; G01R 35/007; G01V 13/00; G01V 3/081; G06F 3/04847; G06F 3/165; G06F 18/25; G06F 2203/0331; G06F 2203/0383; G06F 3/014; G06F 3/017; G06F 3/0233; G06F 3/0346
See application file for complete search history.

(56) References Cited

U.S. PATENT DOCUMENTS

| | | | |
|---|---|---|---|
| 8,838,403 B2 | 9/2014 | Del Castillo et al. | |
| 9,229,084 B2 | 1/2016 | Tu | |
| 9,506,755 B2* | 11/2016 | Tu ........................ | G01C 17/28 |
| 9,683,865 B2 | 6/2017 | Keal et al. | |
| 11,047,682 B2 | 6/2021 | Han et al. | |
| 2012/0098525 A1* | 4/2012 | Snow ................ | G01R 33/0035 |
| | | | 324/202 |
| 2016/0041234 A1* | 2/2016 | Li ........................ | G01V 3/081 |
| | | | 324/202 |
| 2019/0041209 A1* | 2/2019 | D'Alfonso ......... | G01R 33/0017 |
| 2020/0233053 A1 | 7/2020 | Vissiere et al. | |
| 2021/0072335 A1* | 3/2021 | Dervisoglu ........ | G01R 33/0076 |
| 2021/0247206 A1 | 8/2021 | Vissiere et al. | |

* cited by examiner

*Primary Examiner* — Alvaro E Fortich
(74) *Attorney, Agent, or Firm* — Fish & Richardson P.C.

(57) ABSTRACT

A method of calibrating a magnetometer may include; obtaining at least four measurement values using the magnetometer, calculating a center and a radius of a sphere in accordance with the measurement values, wherein the center and the radius of the sphere correspond to an internal magnetic field associated with an electronic device including the magnetometer, and calibrating an output of the magnetometer in accordance with the center of the sphere.

20 Claims, 20 Drawing Sheets

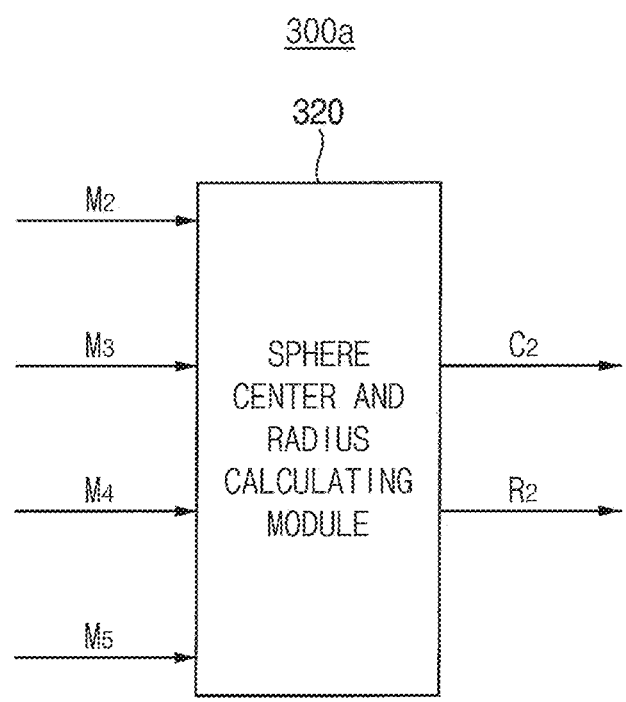

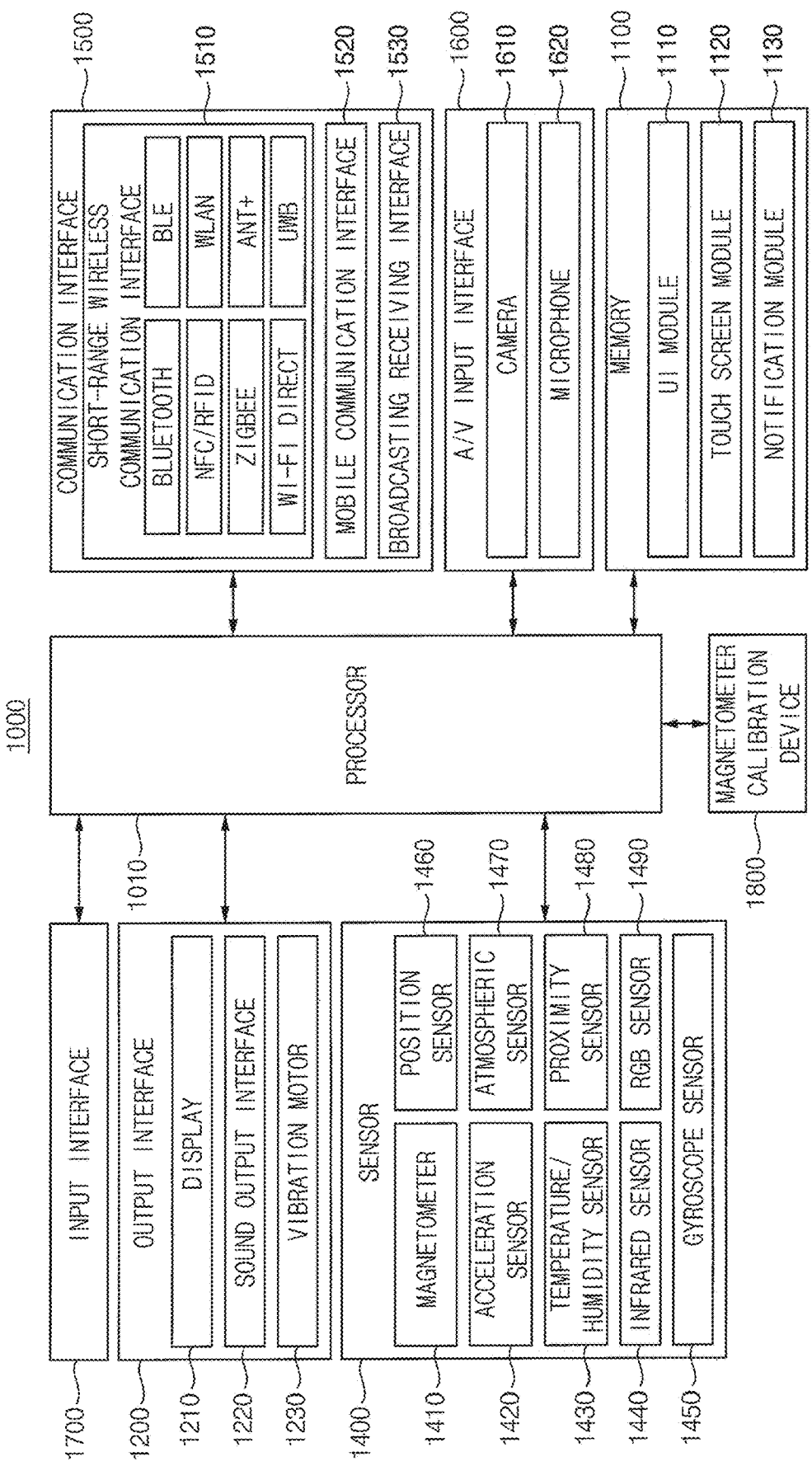

METHOD CALIBRATING MAGNETOMETER AND MAGNETOMETER CALIBRATION DEVICE

CROSS-REFERENCE TO RELATED APPLICATIONS

This application claims priority under 35 USC § 119 to Korean Patent Application No. 10-2021-0155788 filed on Nov. 12, 2021 and to Korean Patent Application No. 10-2022-0018711 filed on Feb. 14, 2022, the collective subject matter of which is hereby incorporated by reference in its entirety.

BACKGROUND

1. Technical Field

Embodiments of the inventive concept relate generally to devices including a magnetometer, and more particularly to devices capable of performing magnetometer calibration. Embodiments of the inventive concept also relate to methods of calibrating a magnetometer.

2. Description of the Related Art

Many hand-held portable electronic devices that provide navigational and/or device orientation functionality as an aid to users. In one example, smart phones may provide a navigational display that maps a region identified by a user. Such navigational displays may be used to plot the position of the user within the region and/or plot a path directing the user through the region. In another example, hand-held gaming controllers or remote controllers may use orientation functionality to provide control of a video game, computing system, and/or remote apparatus. In this regard, various portable electronic devices may include an on-board magnetometer (e.g., a magnetic field sensor) integral to the provision of navigational and/or orientation functionality.

A magnetometer may be used to provide positioning information for a device in relation to the vector of an external magnetic field (hereafter "magnetic vector"). However, the magnetic vector, or perceptions of the magnetic vector may be variously affected by a number of factors. For example, measurements made using a device including a magnetometer may errantly detect (or interrupt) the position of a magnetic vector due to one or more interfering magnetic fields related to proximate electrical circuitry, ferromagnetic components, etc. Such potentially interfering magnetic fields may be referred to as internal magnetic fields associated with the device.

SUMMARY

Embodiments of the inventive concept provide devices including a magnetometer that are capable of more efficiently calibrating the magnetometer by estimating and compensating for various internal magnetic fields associated with the device.

Embodiments of the inventive concept also provide a magnetometer calibration device capable of efficiently calibrating a magnetometer within an electronic device.

Embodiments of the inventive concept also provide methods of efficiently calibrating a magnetometer within an electronic device.

In one aspect of the inventive concept, a method of calibrating a magnetometer may include; obtaining at least four measurement values using the magnetometer, calculating a center and a radius of a sphere in accordance with the measurement values, wherein the center and the radius of the sphere correspond to an internal magnetic field associated with an electronic device including the magnetometer, and calibrating an output of the magnetometer in accordance with the center of the sphere.

In another aspect of the inventive concept, a magnetometer calibration device may include; a measurement value obtaining module connected to a magnetometer and configured to obtain at least four measurement values, a calculating module configured to calculate a center and a radius of a sphere in accordance with the at least four measurement values, wherein the center and the radius of the sphere correspond to an internal magnetic field associated with an electronic device including the magnetometer, and a calibrating module configured to calibrate an output of the magnetometer in accordance with the center of the sphere.

In still another aspect of the inventive concept, a method of calibrating a magnetometer may include; periodically obtaining at least four measurement values using the magnetometer, periodically calculating a center and a radius of a sphere in accordance with the at least four measurement values, and continuously calibrating an output of the magnetometer in accordance with the center of the sphere, wherein the periodically obtaining of the at least four measurement values includes sequentially obtaining a first measurement value, a second measurement value, a third measurement value and a fourth measurement value, the periodically calculating of the center and the radius of the sphere includes; performing a sphere singularity check including at least one of a proximity check and a coplanarity check on the first measurement value, the second measurement value, the third measurement value and the fourth measurement value, calculating a first center value corresponding to the center of the sphere and a first radius value corresponding to the radius of the sphere in accordance with the first measurement value, the second measurement value, the third measurement value and the fourth measurement value, performing a radius adequacy check including at least one of an operation of checking whether the first radius value falls within a first reference range and an operation of checking whether an amplitude associated with the first center value falls within a second reference range, and performing a filtering operation on the first center value, and the continuously calibrating of the output of the magnetometer includes subtracting the first center value from the fourth measurement value.

BRIEF DESCRIPTION OF THE DRAWINGS

Advantages, benefits and features, as well as the making and use of the inventive concept, may be better understood upon consideration of the following detailed description together with the accompanying drawings, in which:

FIGS. 11A and 11B are respective block diagrams further illustrating operation of the calculating module 300a of FIG. 10;

FIG. 20 is a block diagram illustrating an electronic device according to embodiments of the inventive concept;

DETAILED DESCRIPTION

Throughout the written description and drawings, like reference numbers and labels are used to denote like or similar elements, components, features and/or method steps.

Figure 1:
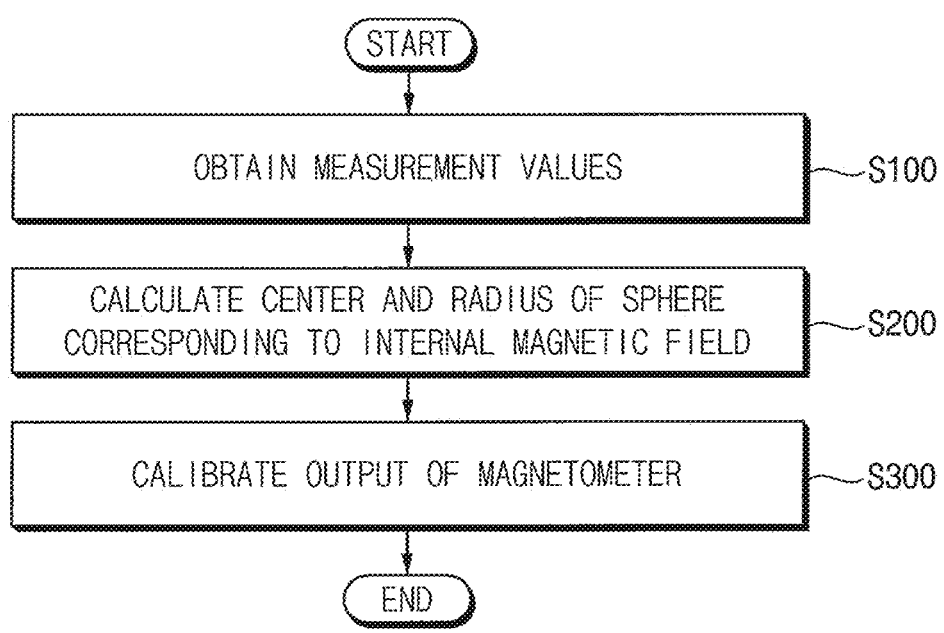
FIG. 1 is a flowchart illustrating a method of calibrating a magnetometer according to embodiments of the inventive concept.

FIG. 1 is a flowchart illustrating a method of calibrating a magnetometer according embodiments of the inventive concept.

Referring to FIG. 1, the method of calibrating a magnetometer may be performed by a magnetometer calibration device connected to a magnetometer or a magnetic field sensor. Here, the magnetometer and the magnetometer calibration device are assumed to be included within an electronic device.

The method of calibrating a magnetometer may begin by obtaining (or acquiring) a number of measurement values using the magnetometer (S100). In some embodiments, the number of measurement values may be at least four (4). In this regard, each of the measurement values may be output from the magnetometer, and may be conceptually as a vector (or radius) extending from a center (or origin) to point plotted in a three-dimensional (3D) space corresponding to (or representing) an orientation of a magnetic field, as measured by the magnetometer. Example(s) of this approach will be described hereafter in some additional detail with reference to FIGS. 4 and 5.

Thereafter, a center and a radius of a sphere corresponding to an internal magnetic field associated with the electronic device may be calculated in relation to the measurement values (S200). For example, assuming the acquiring of at least four measurements values, the center and radius of the sphere may be calculated in accordance with four measurement values among the measurement values. That is, the center and radius of the sphere may be calculated using only the four measurement values, without additional information. Example(s) of this approach will be described hereafter in some additional detail with reference to FIGS. 8, 9, 12, 13, 14 and 15.

Then, an output of the magnetometer may be calibrated in accordance with the center of the sphere (S300). For example, one of the a number of measurement values may be calibrated in accordance with a center value corresponding to the center of the sphere.

In some embodiments, the output of the magnetometer may be continuously calibrated in accordance with the center of the sphere, as it is periodically calculated (or updated). Example(s) of this approach will be described hereafter in some additional detail with reference to FIGS. 17 and 18.

Here, the output of the magnetometer may be understood as providing information regarding how a geomagnetic field deviates from a magnetic field generated by device-bias. With respect to the device-bias, ferromagnetic component(s) included within the electronic device including the magnetometer may produce a corresponding, internal magnetic field. Additionally, each conductive element passing a constant electrical current may produce a corresponding internal magnetic field. Hence, error(s) may occur in the output of the magnetometer due to such these internal magnetic fields. It follows that some type of calibration procedure is required to compensate for and/or correct the output of the magnetometer.

According to methods of calibrating a magnetometer according to embodiments of the inventive concept, an internal magnetic field may be estimated using only the output of the magnetometer - without requirement of additional information. As a result, the output of the magnetometer may be rapidly calibrated using the estimated internal magnetic field.

In some embodiments, calibration of the magnetometer may be continuously and/or periodically performed using an iterative calibration approach using only four measurement values. Accordingly, magnetometers associated with embodiments of the inventive concept may be quickly, accurately and efficiently calibrated. Further, overall computational burden and power consumption required for calibrating the magnetometer may be reduced. Accordingly, the performance and efficiency of various operations performed using the magnetometer may be improved.

Figure 2:
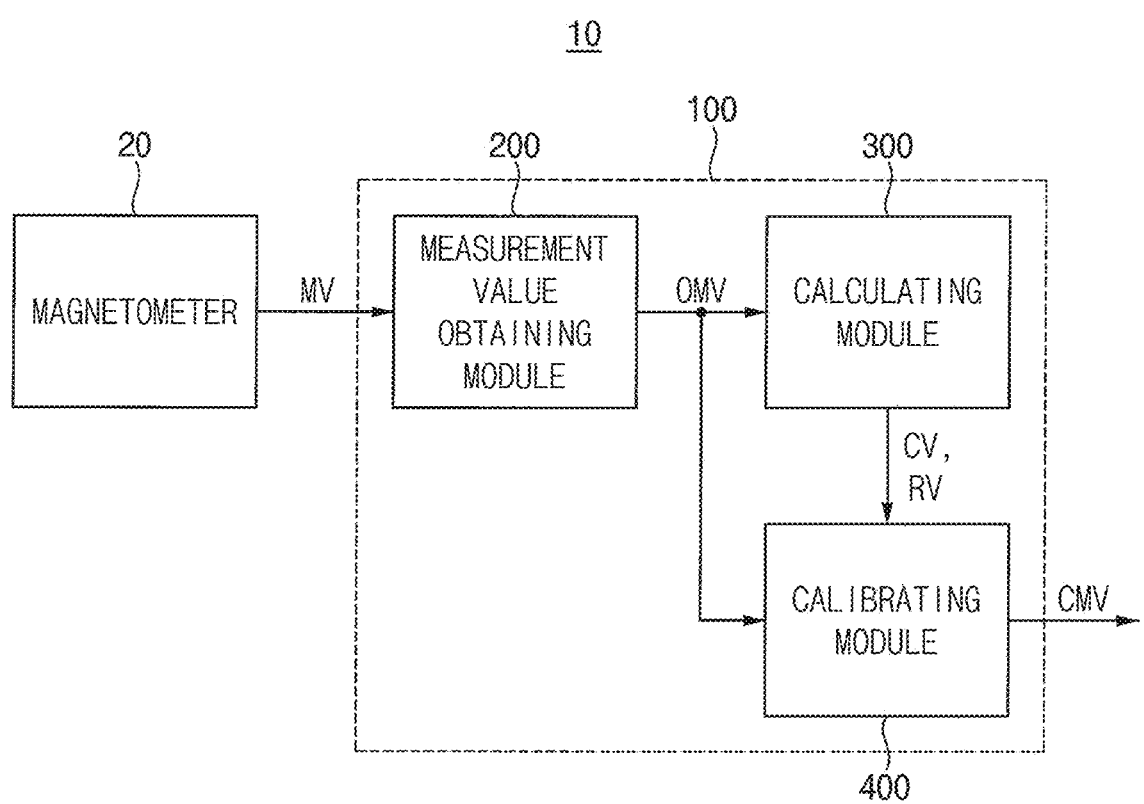
FIG. 2 is a block diagram illustrating a magnetometer calibration device within an electronic device including a magnetometer according to embodiments of the inventive concept.

FIG. 2 is a block diagram illustrating a magnetometer calibration device 100 according to embodiments of the inventive concept.

Referring to FIG. 2, an electronic device 10 generally includes a magnetometer 20 and the magnetometer calibration device 100.

In some embodiments, the electronic device 10 may one of various devices capable of changing orientation in space and including the magnetometer 20. For example, the electronic device 10 may be; a mobile device, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc. One example of the electronic device 10 will be described hereafter in some additional detail with reference to FIG. 20.

The magnetometer 20 may generate and provide raw measurement values MV. (Hereafter, the raw measurement values MV may be referred to as basic or original measurement values. Each of the raw measurement values MV may corresponding to a three-dimensional point corresponding to a magnetic field (e.g., a magnetic field vector), as measured by the magnetometer 20. For example, as will be described in some additional detail with reference to FIG. 3, each of the raw measurement values MV may include an 'x' value defined in relation to an X-axis, a 'y' value defined in relation to a Y-axis, and a 'z' value defined in relation to a Z-axis. In some embodiments, the magnetometer 20 may provide raw measurement values MV at a relatively high sampling frequency (or rate) (e.g., at about 25, 50, 100, 200 or 400 Hz).

The magnetometer calibration device 100 may estimate an internal magnetic field for the electronic device 10 (e.g., generate an estimated internal magnetic field) in response to raw measurement values MV provided by the magnetometer 20. The magnetometer calibration device 100 may then calibrate an output of the magnetometer 20 in accordance with the estimated internal magnetic field.

In some embodiments of the inventive concept, like the embodiment illustrated in FIG. 1, the magnetometer calibration device 100 may include a measurement value obtaining module 200, a calculating module 300 and a calibrating module 400.

Herein, the term "module" may be understood as denoting, for example, a component implemented using software and/or hardware, such as a field programmable gate array (FPGA) or an application specific integrated circuit (ASIC). In this regard, a module may be configured to reside, wholly or in part, within tangible, addressable storage medium and may executable by one or more processors. Illustrative examples of a module various include; various components (e.g., software components, object-oriented software components, class components and task components), processes, functions, routines, code segments, drivers, firmware, microcode, circuitry, data, databases, data structures, tables, arrays, and variables. Those skilled in the art will appreciate that a module may be arbitrarily divided into multiple modules, or multiple modules may be arbitrarily combined into a single module—depending on functionality and design architecture.

The measurement value obtaining module 200 may be used to obtain (or generate) measurement values OMV corresponding to the raw measurement values MV provided by the magnetometer 20, wherein a number of the of measurement values OMV is at least four. In this regard, the measurement values OMV may be included, wholly or in part, within the raw measurement values MV. As with each of the raw measurement values MV, each of the measurement values OMV may be expressed in terms of an 'x' value, a 'y' value and a 'z' value. In some embodiments, the measurement value obtaining module 200 may obtain the measurement values OMV at a relatively low frequency or rate (e.g., at about 0.5 to 2 Hz). One example of the measurement value obtaining module 200 will be described hereafter in some additional detail with reference to FIG. 6.

The calculating module 300 may be used to calculate a center and a radius of a sphere in accordance with the measurement values OMV, and may accordingly generate a center value CV and a radius value RV. Here, the center and the radius of the sphere correspond to an internal magnetic field associated with the electronic device 10. The center value CV may represent the center of the sphere, and the radius value RV may represent the radius of the sphere. In some embodiments, the center and radius of the sphere may be calculated using four or more measurement values among the measurement values OMV.

In some embodiments, the calculating module 300 may perform at least one of a first verification operation determining whether the measurement values OMV are suitable, a second verification operation determining whether the center value CV and/or the radius value RV is (are) suitable, and a filtering operation associated with the center value CV and/or the radius value RV.

One example of the calculating module 300 will be described hereafter in some additional detail with reference to FIGS. 10 and 16.

The calibrating module 400 may be used to calibrate the output of the magnetometer 20 in response to the center value CV corresponding to the center of the sphere, and may generate a calibrated measurement value CMV as a result of the calibration. For example, the measurement values OMV may be calibrated in accordance with the center value CV. Alternately or additionally, the raw measurement values MV may be calibrated in accordance with the center value CV.

In this regard, the measurement value obtaining module 200 may periodically obtain the measurement values OMV, the calculating module 300 may periodically calculate (or update) the center value CV and the radius value RV, and the calibrating module 400 may continuously and periodically generate the calibrated measurement value CMV.

In some embodiments, at least part of the measurement value obtaining module 200, the calculating module 300 and the calibrating module 400 may be implemented as hardware. For example, at least part of the measurement value obtaining module 200, the calculating module 300 and the calibrating module 400 may be included in a computer-based electronic system. In other embodiments, at least part of the measurement value obtaining module 200, the calculating module 300 and the calibrating module 400 may be implemented as instruction code, program routines and/or software. Here, the instruction code, program routines and/or software may be executed by a computer-based electronic system, and may be stored in any storage device within, and/or external to, the computer-based electronic system.

Figure 3:
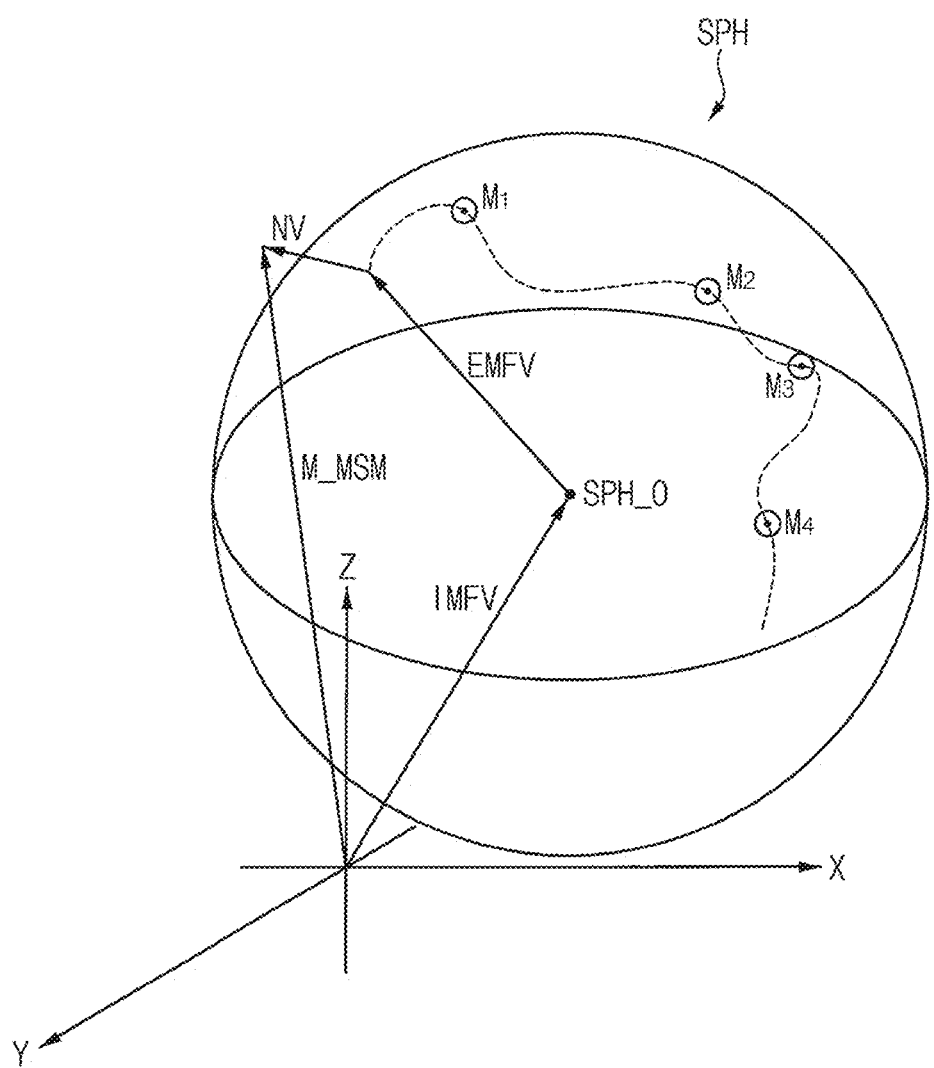
FIG. 3 is a conceptual diagram further illustrating a method of calibrating a magnetometer, as well as operation of a magnetometer calibration device according to embodiments of the inventive concept.

FIG. 3 is a conceptual diagram further illustrating a method of calibrating a magnetometer and operation of a magnetometer calibration device according to embodiments of the inventive concept.

Referring to FIGS. 2 and 3, an internal magnetic field vector IMFV represents an internal magnetic field generated by components included in the electronic device 10, an external magnetic field vector EMFV represents an external magnetic field (e.g., the magnetic field of Earth) relative to the electronic device 10 and to-be-measured by the magnetometer 20, and a noise vector NV represents various noise component(s) generated during operation of the magnetometer 20. A magnetometer vector M_MSM represents a measurement value (e.g., raw measurement values MV) as actually output by the magnetometer 20. Each of the X-axis, Y-axis, and Z-axis serves to define a magnitude of the magnetic field, wherein a unit value for each of these axes may Tesla (e.g., T or uT).

When the electronic device 10 including the magnetometer 20 is rotated in space, a tip of the internal magnetic field vector IMFV may be stable in a device coordinate system. At the same time, a tip of the external magnetic field vector EMFV may be moving on a surface of a sphere SPH having a center SPH_O pointed by the internal magnetic field vector IMFV. A radius of the sphere SPH may be defined as a magnitude of the external magnetic field vector EMFV (e.g., a strength of the external magnetic field). The measurement value output provided by the magnetometer 20 may include a sum of the internal magnetic field and the external magnetic field disturbed by noise. In other words, the magnetometer vector M_MSM may correspond to a sum of the internal magnetic field vector IMFV, the external magnetic field vector EMFV and the noise vector NV.

During a method of calibrating the magnetometer according to embodiments of the inventive concept, four measurement values $M_1$, $M_2$, $M_3$ and $M_4$ may be generated and obtained when the electronic device 10 changes its orientation in space (e.g., in relation to the magnetic field vector). Thereafter, the sphere SPH may be generated in accordance with the four measurement values $M_1$, $M_2$, $M_3$ and $M_4$. The center SPH_O of the sphere SPH may represent the tip of the internal magnetic field vector IMFV, and thus the internal magnetic field may be estimated and compensated for in relation to the center SPH_O of the sphere SPH.

Figure 4:
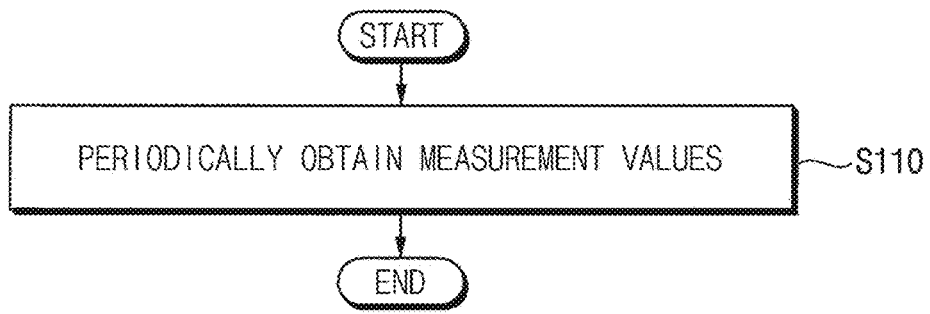
FIG. 4 is a flowchart further illustrating in one example the method step (S100) of obtaining measurement values in FIG. 1.

FIG. 4 is a flowchart further illustrating in one example the method step of obtaining measurement values (S100) of FIG. 1.

Referring to FIGS. 1 and 4, the method step of obtaining measurement values (S100), may be implemented by periodically obtaining measurement values using the magnetometer (S110). In some embodiments, steps S100 and S110 may be performed by the measurement value obtaining module 200 of FIG. 2, and the measurement values OMV may be obtained at a relatively slow frequency.

Figure 5:
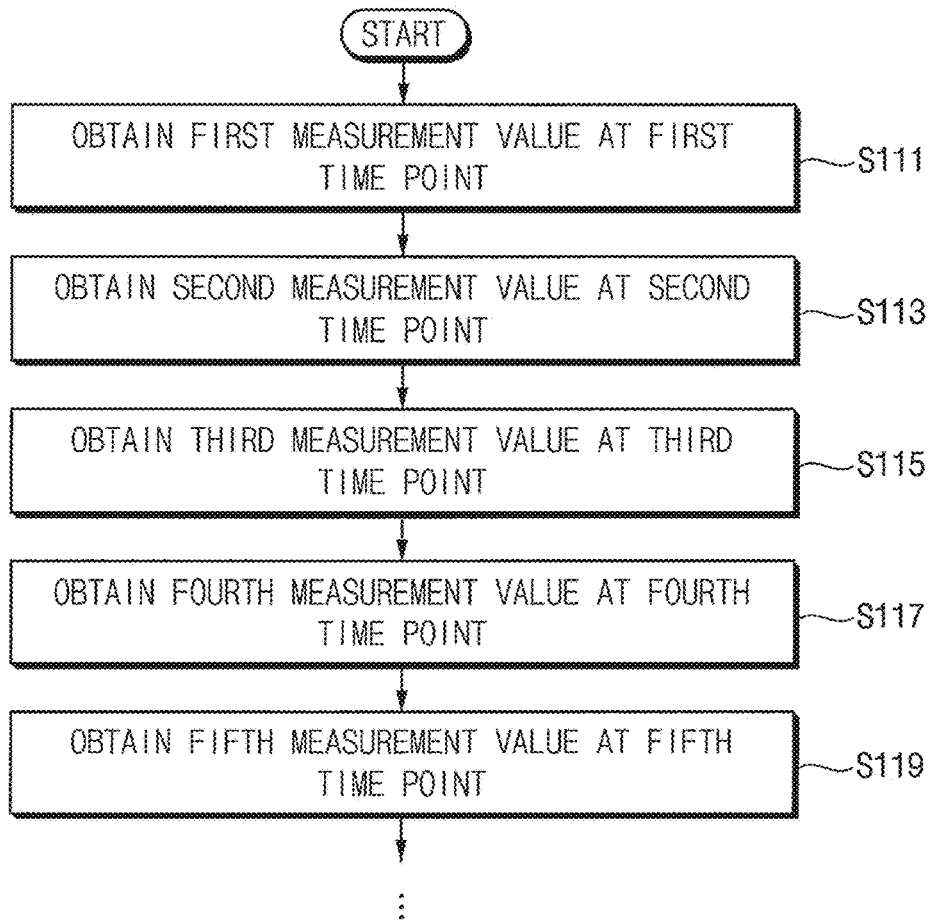
FIG. 5 is a flowchart further illustrating in one example the method step (S110) of periodically obtaining the measurement values in FIG. 4.

FIG. 5 is a flowchart further illustrating in one example the method step of periodically obtaining the measurement values (S110) of FIG. 4.

Referring to FIGS. 4 and 5, the method step of periodically obtaining the measurement values (S110) may be accomplished by obtaining a first measurement value from the magnetometer at a first time point (S111); obtaining a second measurement value from the magnetometer at a second time point following the first time point (S113); obtaining a third measurement value from the magnetometer at a third time point following the second time point (S115); obtaining a fourth measurement value from the magnetometer at a fourth time point following the third time point (S117); and obtaining a fifth measurement value from the magnetometer at a fifth time point following the fourth time point (S119).

In some embodiments, the foregoing method steps of obtaining respective measurement value may be periodically performed at predetermined time intervals (e.g., a first time interval between the first time point and the second time point, a second time interval between the second time point and the third time point, a third time interval between the third time point and the fourth time point, and a fourth time interval between the fourth time point and the fifth time point). Here, the first, second, third and fourth time intervals may have substantially the same duration). And from the foregoing, those skilled in the art will appreciate that additional measurement values (e.g., beyond a fifth measurement value) may be periodically obtained by embodiments of the inventive concept.

Figure 6:
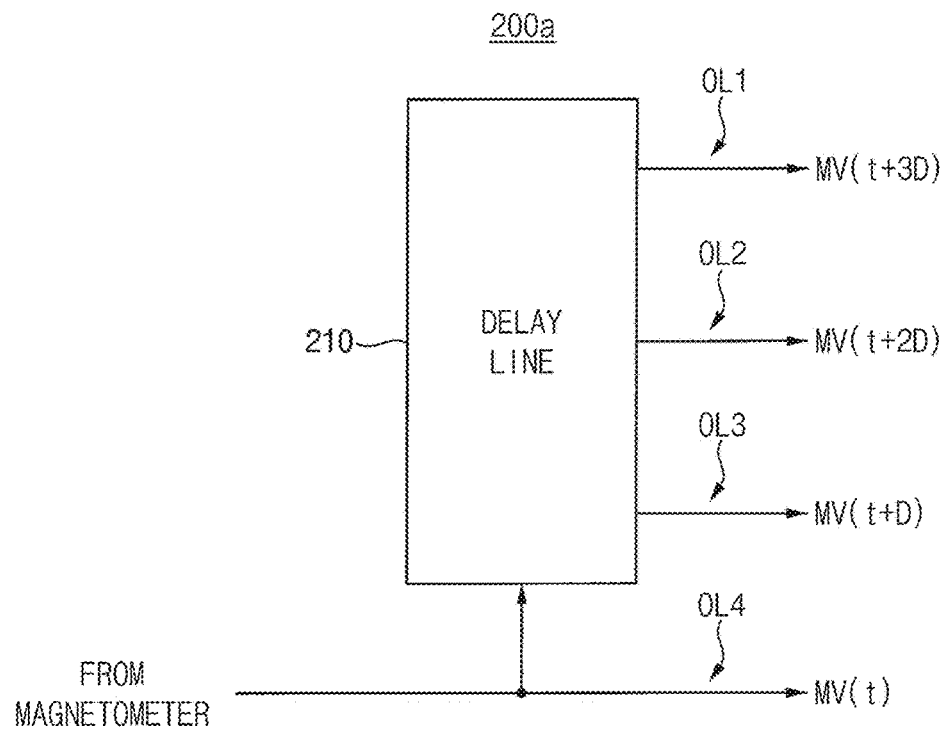
FIG. 6 is a block diagram further illustrating in one example the measurement value obtaining module 200 of the magnetometer calibration device of FIG. 2.

FIG. 6 is a block diagram illustrating one example of the measurement value obtaining module 200 of FIG. 2.

Referring to FIGS. 2 and 6, a measurement value obtaining module 200a may include a delay line 210, a first output line OL1, a second output line OL2, a third output line OL3 and a fourth output line OL4.

Here, the delay line 210 may be connected to the output of the magnetometer 20 of FIG. 2. That is, the delay line 210 may delay at least one of the raw measurement values MV received from the magnetometer 20 in order to generate corresponding, delayed measurement values through the first output line OL1, the second output line OL2 and the third output line OL3. Of note, the fourth output line OL4 is assumed to be directly connected to the output of the magnetometer 20, and provides one of the raw measurement values MV without delay.

For example, assuming that a measurement value MV(t) is received from the magnetometer 20 at a time 't', the measurement value MV(t) is provided through the fourth output line OL4 without material delay. However, the delay line 210 delays the measurement value MV(t) by a first delay time D, such that a delayed measurement value MV(t+D) is provided through the third output line OL3. The delay line 210 delays the measurement value MV(t) by a second delay time 2D, such that a delayed measurement value MV(t+2D) is provided through the second output line OL2, and the delay line 210 delays the measurement value MV(t) by a third delay time 3D, such that a delayed measurement value MV(t+3D) is provided through the first output line OL1.

Thus, with respect to one specific time (e.g., current time), the measurement value MV(t+3D) provided through the first output line OL1 may be a measurement value received before the third delay time 3D from the current time. With respect to the current time, the measurement value MV(t+2D) provided through the second output line OL2 may be a measurement value received before the second delay time 2D from the current time. With respect to the current time, the measurement value MV(t+D) provided through the third output line OL3 may be a measurement value received before the first delay time D from the current time, and the measurement value MV(t) provided through the fourth output line OL4 may be a measurement value received at the current time. Hence, the measurement values MV(t+3D), MV(t+2D), MV(t+D) and MV(t) may respectively correspond to the measurement values OMV of FIG. 2.

In some embodiments, the second delay time 2D may be about twice that of the first delay time D, and the third delay time 3D may be about thrice that of the first delay time D. In some embodiments, the first delay time D may be substantially the same as a time interval or period during which the operation of obtaining each measurement value is performed.

Figure 7A:
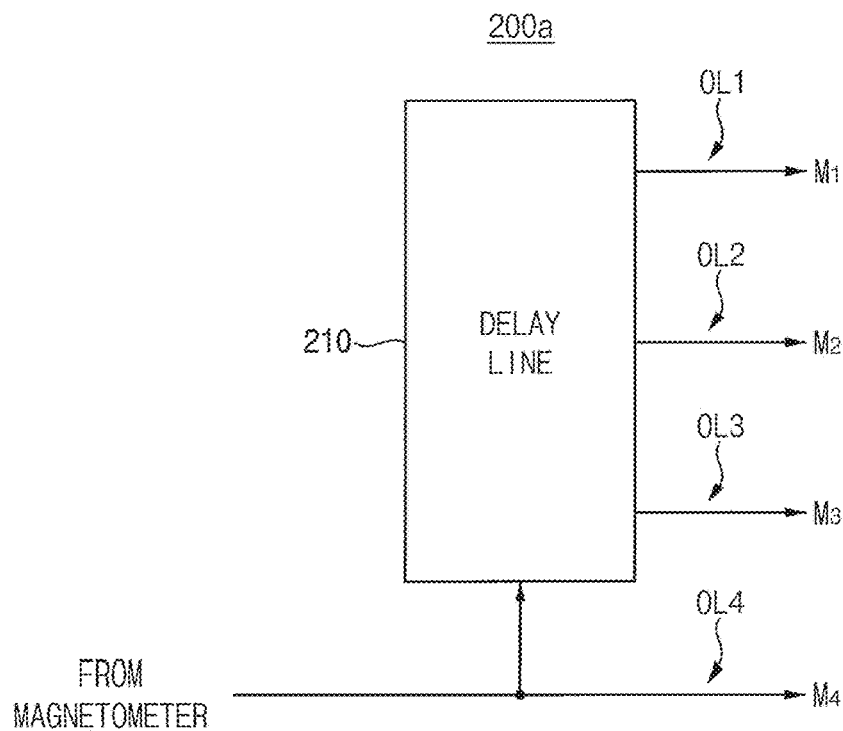
FIGS. 7A, 7B and 7C are respective diagrams further illustrating operation of the measurement value obtaining module 200a of FIG. 6.
Figure 7B:
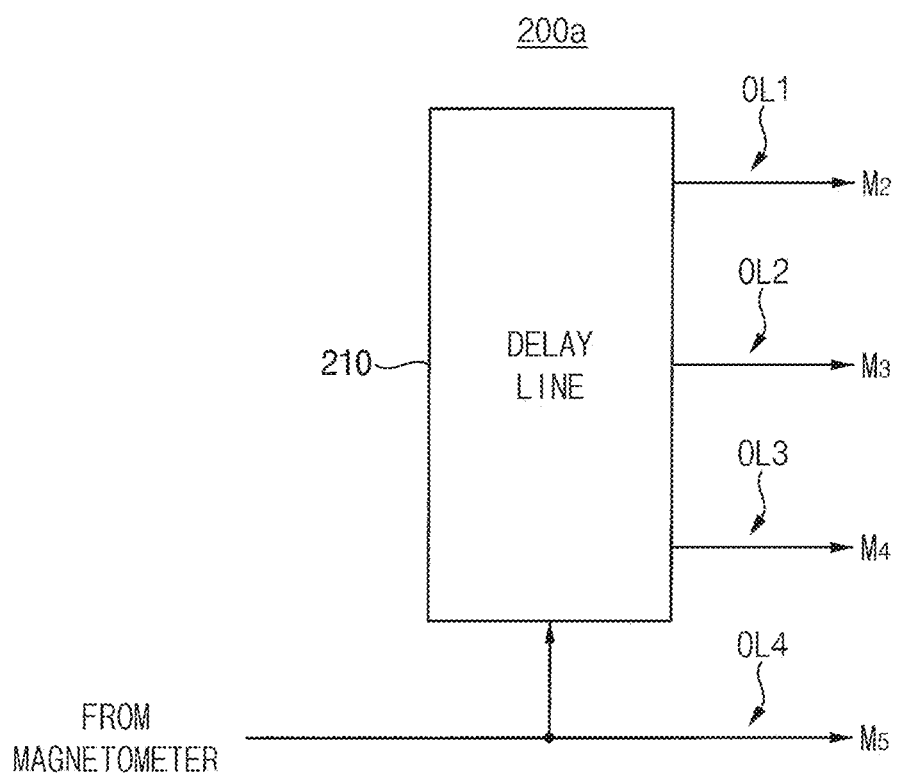
Figure 7C:
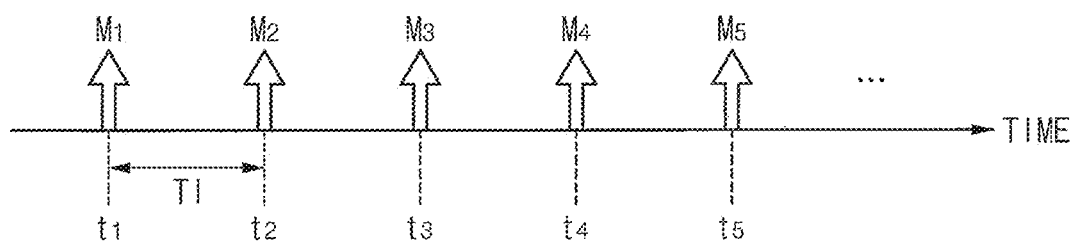

FIGS. 7A, 7B and 7C are respective diagrams further illustrating operation of the measurement value 200a of FIG. 6.

Referring to FIGS. 7A, 7B and 7C, it is assumed that the measurement value obtaining module 200a periodically obtains the measurement values $M_1$, $M_2$, $M_3$, $M_4$ and $M_5$, as described in relation to FIGS. 4 and 5.

As illustrated in FIG. 7C, the measurement values $M_1$, $M_2$, $M_3$, $M_4$ and $M_5$ may be periodically obtained every predetermined time interval TI in accordance with the raw measurement values MV provided by the magnetometer 20. For example, the first measurement value $M_1$ may be obtained at a first time point $t_1$, the second measurement value $M_2$ may be obtained at a second time point $t_2$, the third measurement value $M_3$ may be obtained at a third time point $t_3$, the fourth measurement value $M_4$ may be obtained at a fourth time point $t_4$, and the fifth measurement value $M_5$ may be obtained at a fifth time point $t_5$.

In one example, at the first time point $t_1$, the first measurement value $M_1$ may be provided through the fourth output line OL4. At the second time point $t_2$, the first measurement value $M_1$ may be provided through the third output line OL3, and the second measurement value $M_2$ may be provided through the fourth output line OL4. At the third time point $t_3$, the first measurement value $M_1$ may be provided through the second output line OL2, the second measurement value $M_2$ may be provided through the third output line OL3, and the third measurement value $M_3$ may be provided through the fourth output line OL4.

Thereafter, as illustrated in FIG. 7A, at the fourth time point $t_4$, the first measurement value $M_1$ may be provided through the first output line OL1, the second measurement value $M_2$ may be provided through the second output line OL2, the third measurement value $M_3$ may be provided through the third output line OL3, and the fourth measurement value $M_4$ may be provided through the fourth output line OL4.

Thereafter, as illustrated in FIG. 7B, at the fifth time point $t_5$, the second measurement value $M_2$ may be provided through the first output line OL1, the third measurement value $M_3$ may be provided through the second output line OL2, the fourth measurement value $M_4$ may be provided through the third output line OL3, and the fifth measurement value $M_5$ may be provided through the fourth output line OL4.

Figure 8:
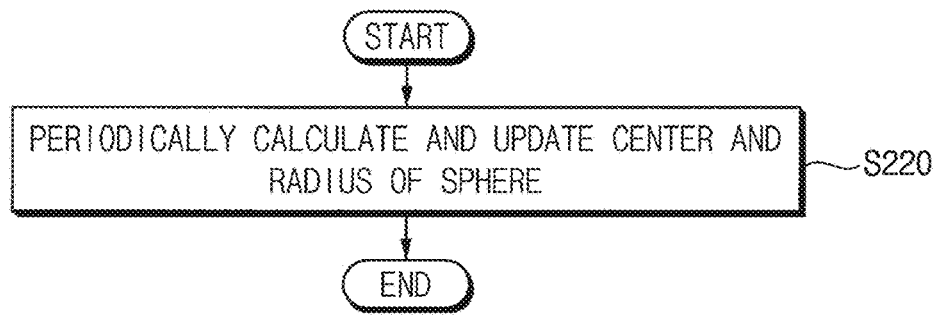
FIG. 8 is a flowchart further illustrating n one example the method step (S200) of calculating the center and the radius of a sphere in FIG. 1.

FIG. 8 is a flowchart further illustrating in one example the method step of calculating a center and a radius of a sphere (S200) of FIG. 1.

Referring to FIGS. 1 and 8, when calculating the center and the radius of the sphere accordance with the measurement values (S200), the center and radius of the sphere may be periodically calculated and updated in accordance with the measurement values that are periodically obtained (S220). In some embodiments, method steps S200 and S220 may be performed by the calculating module 300 of FIG. 2, and one center value and one radius value corresponding to the center and radius of the sphere may be calculated using four measurement values that are sequentially obtained from among the measurement values OMV.

Figure 9:
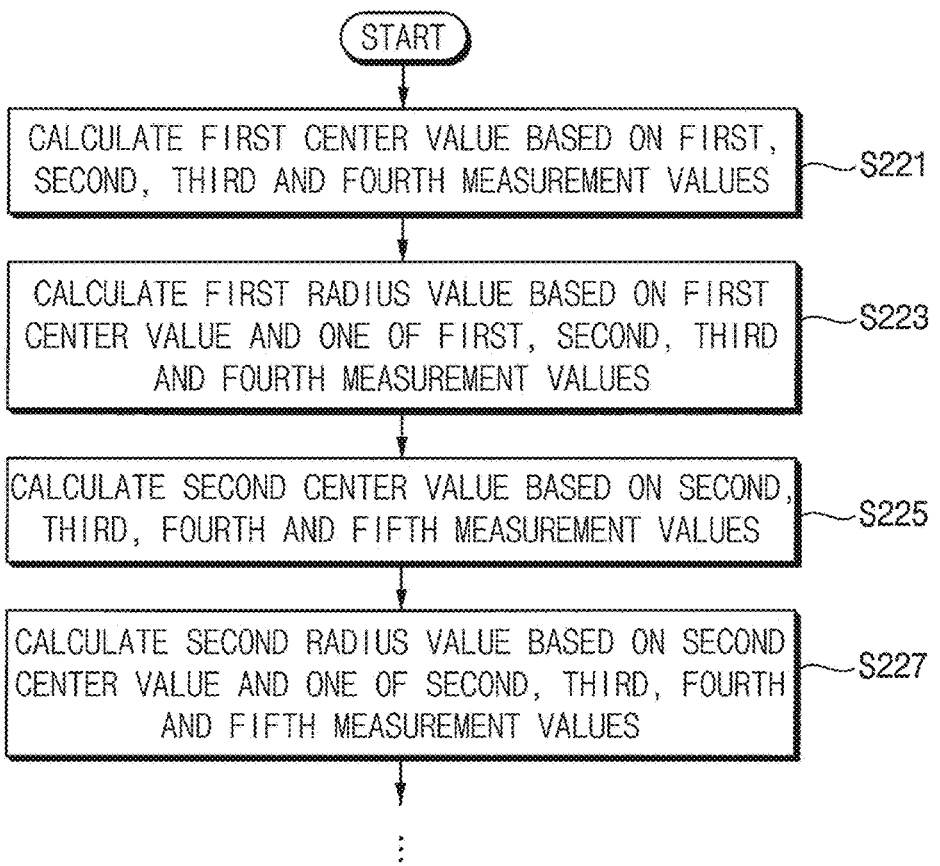
FIG. 9 is a flowchart further illustrating in one example the method step (S22) of periodically calculating and updating the center and the radius of a sphere in FIG. 8.

FIG. 9 is a flowchart further illustrating in one example the method step of periodically calculating and updating a center and a radius of a sphere (S220) of FIG. 8.

Referring to FIGS. 8 and 9, when periodically calculating and updating the center and the radius of the sphere (S220), a first center value corresponding to the center of the sphere may be calculated in accordance with (or based on) the first measurement value, the second measurement value, the third measurement value and the fourth measurement value (e.g., as obtained in steps S111, S113, S115 and S117 of FIG. 5) (S221). A first radius value corresponding to the radius of the sphere may be calculated in accordance with the first center value and one of the first measurement value, the second measurement value, the third measurement value, and the fourth measurement value (S223). Here, for example, method steps S221 and S223 may be performed at or following the fourth time point at which all of the first measurement value, the second measurement value, the third measurement value and the fourth measurement value have been obtained.

Thereafter, a second center value corresponding to the center of the sphere may be calculated in accordance with the second measurement value, the third measurement value, the fourth measurement value and the fifth measurement value obtained in method steps S113, S115, S117 and S119 of FIG. 5 (S225). A second radius value corresponding to the radius of the sphere may be calculated in accordance with the second center value and one of the second measurement value, the third measurement value, the fourth measurement value and the fifth measurement value (S227). For example, method steps S225 and S227 may be performed at or following the fifth time point at which all of the second measurement value, the third measurement value, the fourth measurement value and the fifth measurement value have been obtained.

Although not shown in FIG. 9, center values and radius values may be periodically calculated following method steps S225 and S227. For example, when the sixth measurement value is obtained at the sixth time point following the fifth time point, a third center value corresponding to the center of the sphere may be calculated in accordance with the third measurement value, the fourth measurement value, the fifth measurement value and the sixth measurement value, and a third radius value corresponding to the radius of the sphere may be calculated in accordance with the third center value and one of the third measurement value, the fourth measurement value, the fifth measurement value and the sixth measurement value.

Figure 10:
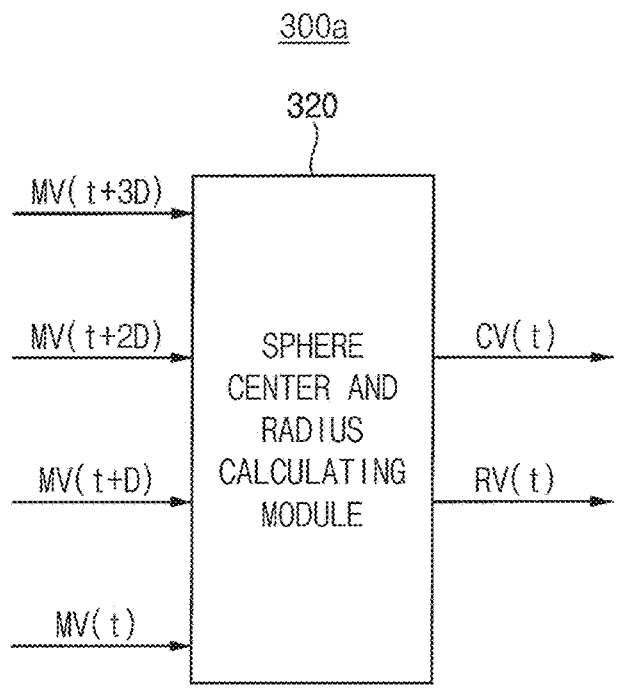
FIG. 10 is a block diagram further illustrating in one example the calculating module 300 of the magnetometer calibration device of FIG. 2.

FIG. 10 is a block diagram further illustrating in one example (300a) the calculating module 300 of the magnetometer calibration device of FIG. 2.

Referring to FIG. 10, the calculating module 300a may include a sphere center and radius calculating module 320.

Here, the sphere center and radius calculating module 320 may calculate a center value CV(t) corresponding to the center of the sphere and a radius value RV(t) corresponding to the radius of the sphere accordance with the measurement values MV(t+3D), MV(t+2D), MV(t+D) and MV(t) that are provided from the measurement value obtaining module 200a of FIG. 6 through the output lines OL1, OL2, OL3 and OL4.

As described in relation to FIG. 6, with respect to a specific time point (e.g., a current time point), the measurement value MV(t+3D) may be the measurement value received before the third delay time 3D from the current time point, the measurement value MV(t+2D) may be the measurement value received before the second delay time 2D from the current time point, the measurement value MV(t+D) may be the measurement value received before the first delay time D from the current time point, and the measurement value MV(t) may be the measurement value received at the current time point. Thus, the center value CV(t) and the radius value RV(t) may represent the internal magnetic field of the electronic device 10 at the current time point. The center value CV(t) and the radius value RV(t) may correspond to the center value CV and the radius value RV of FIG. 2.

Figure 11A:
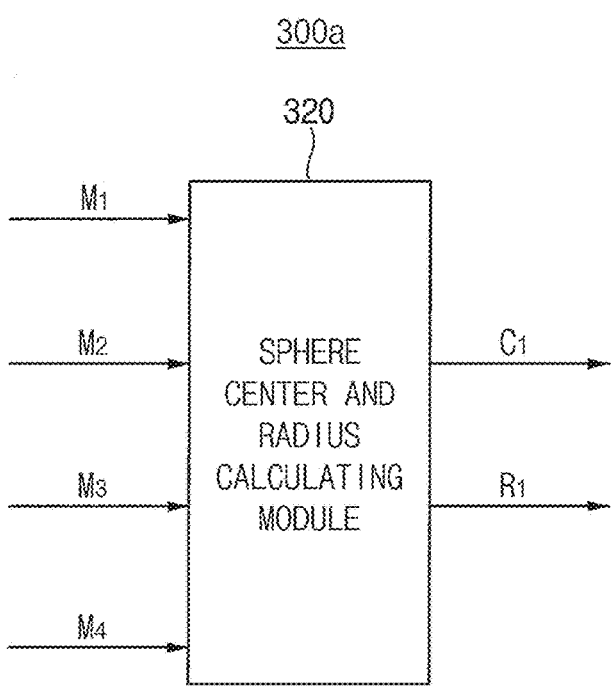

FIGS. 11A and 11B are respective diagrams further illustrating operation of the calculating module 320 of FIG. 10.

Referring to FIGS. 11A and 11B, it is assumed that the calculating module 300a periodically calculates and updates center values $C_1$ and $C_2$ and radius values $R_1$ and $R_2$, as previously described in relation to FIGS. 8 and 9.

When the measurement value obtaining module 200a provides the first measurement value $M_1$, the second measurement value $M_2$, the third measurement value $M_3$ and the fourth measurement value $M_4$ at the fourth time point $t_4$—as described in relation to FIG. 7A, the calculating module 300a may calculate the first center value $C_1$ and the first radius value $R_1$ in accordance with the first measurement value $M_1$, the second measurement value $M_2$, the third measurement value $M_3$ and the fourth measurement value $M_4$, as illustrated in FIG. 11A.

For example, the first measurement value $M_1$, the second measurement value $M_2$, the third measurement value $M_3$ and the fourth measurement value $M_4$ may be respectively expressed as coordinates in accordance with Equation 1, Equation 2, Equation 3 and Equation 4 that follow:

$$M_1(x_1, y_1, z_1) \quad \text{[Equation 1]}$$

$$M_2(x_2, y_2, z_2) \quad \text{[Equation 2]}$$

$$M_3(x_3, y_3, z_3) \quad \text{[Equation 3]}$$

$$M_4(x_4, y_4, z_4) \quad \text{[Equation 4]}$$

Here, a first x value $x_0$, a first y value $y_0$ and a first z value $z_0$ of a coordinate corresponding to the first center value C1 may be calculated in accordance with Equation 5, Equation 6 and Equation 7 that follow:

$$x_0 = \frac{1}{2}\frac{A_x - B_x + C_x - D_x}{U + V + W} \quad \text{[Equation 5]}$$

$$y_0 = -\frac{1}{2}\frac{A_y - B_y + C_y - D_y}{U + V + W} \quad \text{[Equation 6]}$$

$$z_0 = \frac{1}{2}\frac{A_z - B_z + C_z - D_z}{U + V + W} \quad \text{[Equation 7]}$$

In Equation 5, Equation 6 and Equation 7, values 'U', 'V' and 'W' may be obtained in accordance with Equation 8, Equation 9 and Equation 10 that follow:

$$U=(z_1-z_2)(x_3y_4-x_4y_3)-(z_2z_3)(x_4y_1-x_1y_4) \quad \text{[Equation 8]}$$

$$V=(z_3-z_4)(x_1y_2-x_2y_1)-(z_4z_1)(x_2y_3-x_3y_2) \quad \text{[Equation 9]}$$

$$W=(z_1-z_3)(x_4y_2-x_2y_4)-(z_2z_4)(x_1y_3-x_3y_1) \quad \text{[Equation 10]}$$

In Equation 5, values '$A_x$', '$B_x$', '$C_x$' and '$D_x$' may be obtained in accordance with Equation 11, Equation 12, Equation 13 and Equation 14 that follow; in Equation 6, values '$A_y$', $B_y$', $C_y$' and '$D_y$' may be obtained in accordance with Equation 15, Equation 16, Equation 17 and Equation 18 that follow; and in Equation 7, values '$A_z$', '$B_y$', '$C_z$' and $D_z$' may be obtained in accordance with Equation 19, Equation 20, Equation 21 and Equation 22 that follow:

$$A_x(x_1^2+y_1^2+z_1^2)(y_2(z_3-z_4)+y_3(z_4-z_2)+y_4(z_2-z_3)) \quad \text{[Equation 11]}$$

$$B_x(x_2^2+y_2^2+z_2^2)(y_3(z_4-z_1)+y_4(z_1-z_3)+y_1(z_3-z_4)) \quad \text{[Equation 12]}$$

$$C_x(x_3^2+y_3^2+z_2^2)(y_3(z_4-z_1)+y_4(z_1-z_3)+y_1(z_4-z_1)) \quad \text{[Equation 13]}$$

$$D_x(x_4^2+y_4^2+z_4^2)(y_1(z_2-z_3)+y_2(z_3-z_1)+y_3(z_1-z_2)) \quad \text{[Equation 14]}$$

$$A_y(x_1^2+y_1^2+z_1^2)(x_2(z_3-z_4)+x_3(z_4-z_2)+x_4(z_2-z_3)) \quad \text{[Equation 15]}$$

$$B_y(x_2^2+y_2^2+z_2^2)(x_3(z_4-z_1)+x_3(z_1-z_3)+x_1(z_3-z_4)) \quad \text{[Equation 16]}$$

$$C_y(x_3^2+y_3^2+z_3^2)(x_4(z_1-z_2)+x_1(z_2-z_4)+x_2(z_4-z_1)) \quad \text{[Equation 17]}$$

$$D_y(x_4^2+y_4^2+z_4^2)(x_1(z_2-z_3)+x_2(z_3-z_1)+x_3(z_1-z_2)) \quad \text{[Equation 18]}$$

$$A_z(x_1^2+y_1^2+z_1^2)(x_2(y_3-y_4)+x_3(y_4-y_2)+x_4(y_2-y_3)) \quad \text{[Equation 19]}$$

$$B_z(x_2^2+y_2^2+z_2^2)(x_3(y_4-y_1)+x_4(y_1-y_3)+x_1(y_3-y_4)) \quad \text{[Equation 20]}$$

$$C_z(x_3^2+y_3^2+z_3^2)(x_4(y_1-y_2)+x_1(y_2-y_4)+x_2(y_4-y_1)) \quad \text{[Equation 21]}$$

$$D_z(x_4^2+y_4^2+z_4^2)(x_1(y_2-y_3)+x_2(y_3-y_1)+x_3(y_1-y_2)) \quad \text{[Equation 22]}$$

Here, for example, the first radius value $R_1$ may be calculated accordance with the first measurement value $M_1$ and the first center value $C_1$, and may be calculated in accordance with Equation 23 that follows, assuming e.g., that $R=R_1$:

$$R = \sqrt{(x_1 - x_0)^2 + (y_1 - y_0)^2 + (z_1 - z_0)^2} \quad \text{[Equation 23]}$$

Thereafter, when the measurement value obtaining module 200a provides the second measurement value $M_2$, the third measurement value $M_3$, the fourth measurement value $M_4$ and the fifth measurement value $M_5$ at the fifth time point $t_5$ as described with reference to FIG. 7B, the calculating module 300a may calculate the second center value $C_2$ and the second radius value $R_2$ accordance with the second measurement value $M_2$, the third measurement value $M_3$, the fourth measurement value $M_4$ and the fifth measurement value $M_5$, as illustrated in FIG. 11B. For example, the second center value $C_2$ and the second radius value $R_2$ may be calculated in substantially the same manner as the first center value $C_1$ and the first radius value $R_1$, and may be calculated in accordance with the foregoing Equations 1 through 22, inclusive.

If there are no strong magnetic fields nearby, the magnitude of Earth's magnetic vector may be approximately 50 uT. Accordingly, if a length of this magnetic vector as measured by the magnetometer is different, some other (potentially interfering) magnetic field source may be nearby. For example, if the measured magnetic vector is about 300 uT or higher, there is probably a strong magnet nearby. Artificial strong magnets may have relatively small size (not exceeding few centimeters), and their magnetic fields may also be small. Accordingly, even moving the device by a few centimeters may change the external magnetic field measured by the magnetometer, and thus the error may be increased. Information regarding the magnitude of the measured magnetic field vector may be used in relation to an algorithm accuracy estimation.

In this regard, the more angular distance between the measured points, the more accuracy of the algorithm. For example, it may be reasonable to use various constellations of points with angular difference exceeding about 15 degrees. Points selection for sphere parameters calculation should be optimized by measurement rates and device states. For example, there may be no reason to select points when device is motionless or when the magnetic field is not changing in the device frame. Time interval between points should be chosen under a condition that time should be sufficient for device orientation change to an acceptable angle. The optimal frequency for selecting points may be different depending on device movement characteristics.

For example, in practice, it may be better to generate calibration movement when the device is continuously turned in a hand fast for few seconds. In this case, about 5 to 10 Hz may be an appropriate data rate.

Although certain embodiments of the inventive concept have been described in relation to calculating the center and the radius of the sphere in accordance with four measurement values, the scope of the inventive concept is not limited thereto. For example, the center and radius of the sphere may be calculated accordance with five or more measurement values.

Figure 12:
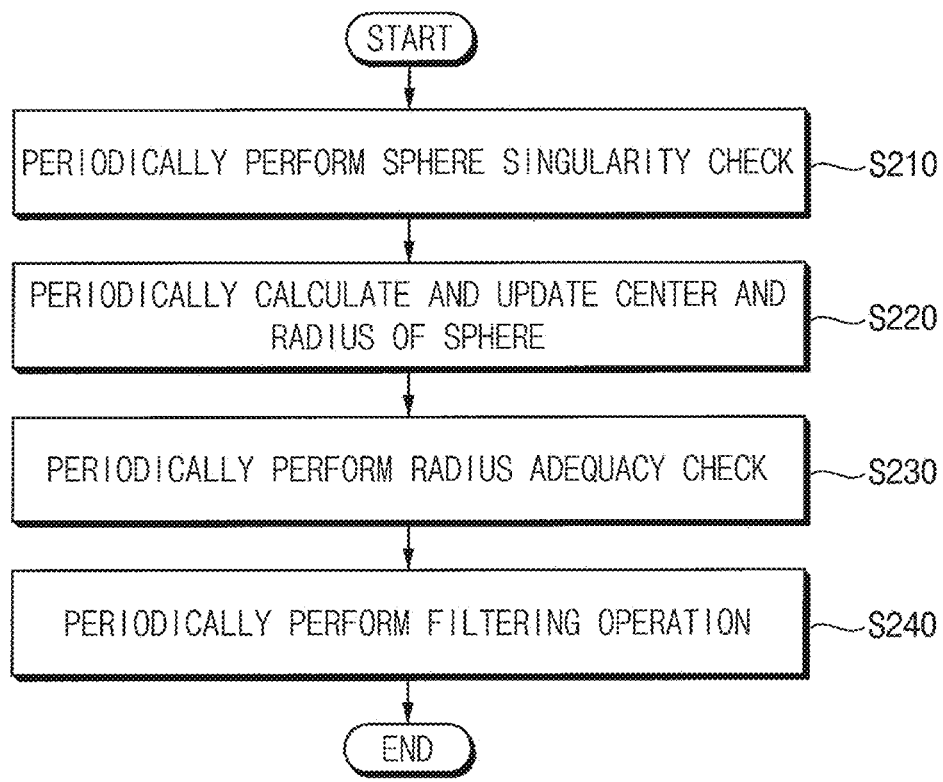
FIG. 12 is a flowchart further illustrating in another example the method step (S200) of calculating the center and the radius of a sphere in FIG. 1.

FIG. 12 is a flowchart further illustrating in another example the method step of calculating a center and a radius of a sphere in FIG. 1.

Referring to FIGS. 1, 8 and 12, it is assumed that the calculating of the center and the radius of the sphere in accordance with the measurement values (S200) is performed in accordance with method step S220 of FIG. 8. However, before periodically calculating and updating the center and radius of the sphere (S220), a sphere singularity check may be periodically performed (S210) in accordance with the measurement values periodically obtained in method step S210. Additionally, following step S220 (e.g., after periodically calculating and updating the center and radius of the sphere), a radius adequacy check may be periodically performed in accordance with the center and radius of the sphere as periodically calculated and updated (S230), and a filtering operation may be periodically performed on the center of the sphere (S240). Here, method step S220 may be substantially the same as that described in relation to FIG. 8.

For example, when steps S221, S223, S225 and S227 are performed in step S220 as described in relation to FIG. 9, the sphere singularity check may be performed in accordance with the first measurement value, the second measurement value, the third measurement value and the fourth measurement value before method step S221, the radius adequacy check may be performed in accordance with the first center value and the first radius value following the method step S223, and the filtering operation may be performed on the first center value following the method step S223. In addition, the sphere singularity check may be performed in accordance with the second measurement value, the third measurement value, the fourth measurement value and the fifth measurement value before step S225, the radius adequacy check may be performed in accordance with the second center value and the second radius value following step S227, and the filtering operation may be performed on the second center value following step S227.

Although certain embodiments of the inventive concept have been described in relation to method steps S210, S230 and S240, the scope of the inventive concept is not limited thereto. For example, one or more of method steps S210, S230 and S240 may be omitted.

Figure 13:
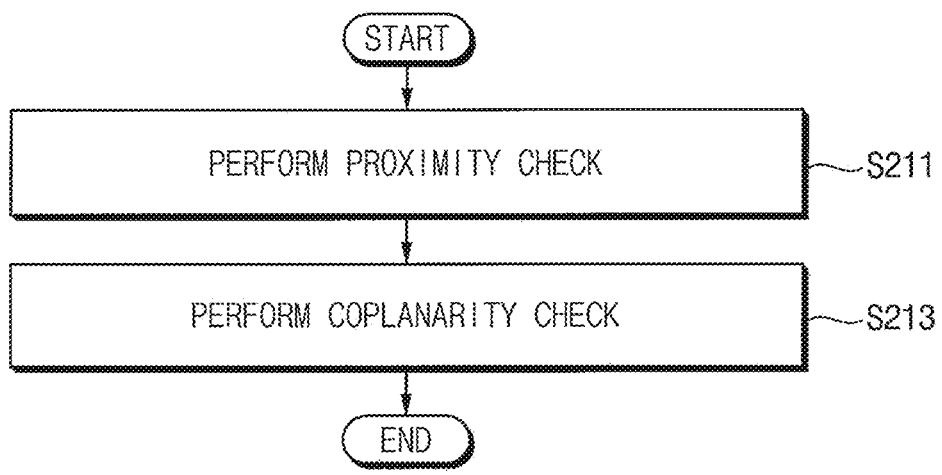
FIG. 13 is a flowchart further illustrating in one example the method step (S210) of performing the sphere singularity check in FIG. 12.

FIG. 13 is a flowchart further illustrating in one example the performing of the sphere singularity check of FIG. 12.

Referring to FIGS. 12 and 13, when periodically performing the sphere singularity check in accordance with the measurement values (S210), a proximity check may be performed on or for the measurement values used to perform method step S220 (S211), and a coplanarity check may be performed on or for the measurement values used to perform method step S220 (S213).

Here, for example, when steps S211 and S213 are performed before step S221 in FIG. 9, the proximity check and the coplanarity check may be performed on the first measurement value $M_1$, the second measurement value $M_2$, the third measurement value $M_3$ and the fourth measurement value $M_4$.

In some embodiments, when the proximity check is performed in step S211, a first average value $M_x$, a second average value $M_y$ and a third average value $M_z$ may be calculated in accordance with Equation 24 that follows; and a first distance $D_x$, a second distance $D_y$ and a third distance $D_z$ may be calculated in accordance with Equation 25 that follows. Thereafter, the first distance $D_x$, the second distance $D_y$ and the third distance $D_z$ may be compared with a threshold value Th, and it may be checked whether the first measurement value $M_1$, the second measurement value $M_2$, the third measurement value $M_3$ and the fourth measurement value $M_4$ stay too close, as represented by Equation 26 that follows:

$$M_x = \frac{x_1 + x_2 + x_3 + x_4}{4};$$
$$M_y = \frac{y_1 + y_2 + y_3 + y_4}{4};$$
$$M_z = \frac{z_1 + z_2 + z_3 + z_4}{4};$$ [Equation 24]

$$D_x = \frac{\sum_{n=1}^{4}(x_n - M_x)^2}{4};$$
$$D_y = \frac{\sum_{n=1}^{4}(y_n - M_y)^2}{4};$$
$$D_z = \frac{\sum_{n=1}^{4}(z_n - M_z)^2}{4};$$ [Equation 25]

$$C = (D_x > Th) \&\& (D_y > Th) \&\& (D_z > Th)$$ [Equation 26]

Upon determining (or checking) that the four measurement values stay too close, it may be further determined that noise exists on the estimated center of the sphere (e.g., the estimation of sphere center could be noisy), and accordingly, execution of the algorithm may be terminated.

For example, assuming that the output of the magnetometer contains noise, the best accuracy may be reached when there are four points on the surface of the sphere, where each point may be far from the other points. If device does not move (e.g., does not change orientation in space), four points that are located very closely may be obtained, and an accuracy of the estimation may be reduced due to such noise and magnetic deviation.

In some example embodiments, when the coplanarity check is performed in method step S213, a parameter 'K_cpl' may be calculated in accordance with Equation 27, Equation 28 and Equation 29 that follow:

$$n1 = (M(t_1) \rightarrow M(t_2)) X (M(t_1) \rightarrow M(t_3))$$ [Equation 27]

$$n2 = (M(t_1) \rightarrow M(t_2)) X (M(t_1) \rightarrow M(t_4))$$ [Equation 28]

$$K\_cpl = \text{norm}(|(n1) X (n2)|)$$ [Equation 29]

In Equation 27, Equation 28, and Equation 29, $(M(t_1) \rightarrow M(t_2))$ denotes a vector from a point $M(t_1)$ to a point $M(t_2)$, ( . . . )X( . . . ) denotes a cross product of vectors, and norm( ) denotes a function that calculates a size of a vector.

The parameter K_cpl may be defined as a coefficient of coplanarity, and may be a numerical value characterizing how close points to the plane. For example, in practice, if the parameter K_cpl is less than 100, it may represent that it is not reasonable to use data because four points are coplanar.

If it is determined that four points stay in one plane, the center of the sphere may not be found, and thus the execution of the algorithm may be stopped or terminated.

Although certain embodiments of the inventive concept have been described in accordance both of method steps S211 and S213, the inventive concept is not limited thereto. For example, only one of the method steps S211 and S213 may be performed.

Figure 14:
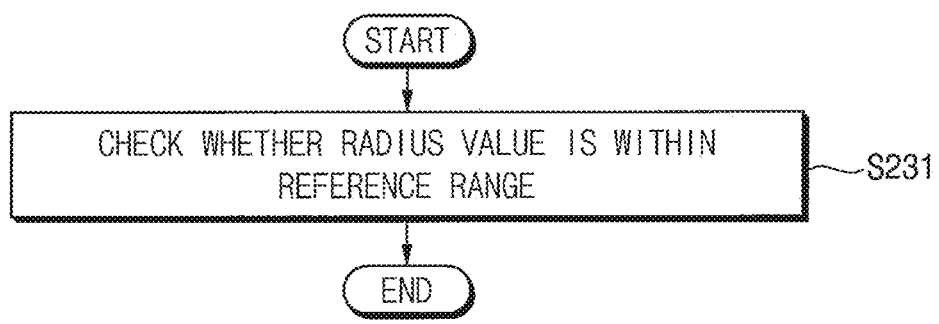
FIGS. 14 and 15 are respective flowcharts variously illustrating examples of the method step (S230) of performing the radius adequacy check in FIG. 12.
Figure 15:
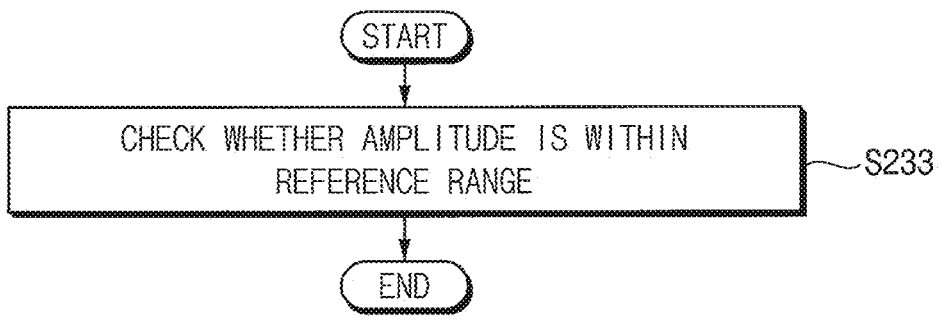

FIGS. 14 and 15 are flowcharts further illustrating examples of the performing of the radius adequacy check of FIG. 12.

Referring to FIGS. 12 and 14, when periodically performing the radius adequacy check in accordance with the center and the radius of the sphere (S230), it may be determined (or checked) whether the radius of the sphere falls within a predetermined reference range (S231).

For example, when method step S231 is performed following method step S223 of FIG. 9, it may be checked whether the first radius value $R_1$ falls within a first reference range (e.g., a physical value or range). For example, the magnetic field of the Earth may have a value of about 50*10e-6 to 220*10e-6 Tesla near the Earth's surface. Thus, if the measured value is out of the above-described range, it may be determined that there is a slight magnetic deviation, and calibration of the device may be required.

Referring to FIGS. 12 and 15, when periodically performing the radius adequacy check in accordance with the center and the radius of the sphere (S230), it may be determined (or checked) whether an amplitude associated with or related to the center of the sphere falls within a predetermined reference range (S233).

For example, when method step S233 is performed following method step S223 in FIG. 9, it may be checked whether the amplitude associated with the first center value $C_1$ falls within a second reference range. For example, if the algorithm is executed and the external magnetic field is stable, the magnitude of the calibrated value of the magnetometer should be stable, otherwise calibration of the device may be required.

Although certain embodiments of the inventive concept have been described in accordance with steps S231 and S233, as individually and/or independently performed, the scope of the inventive concept is not limited thereto. For example, both steps S231 and S233 may be performed.

Figure 16:
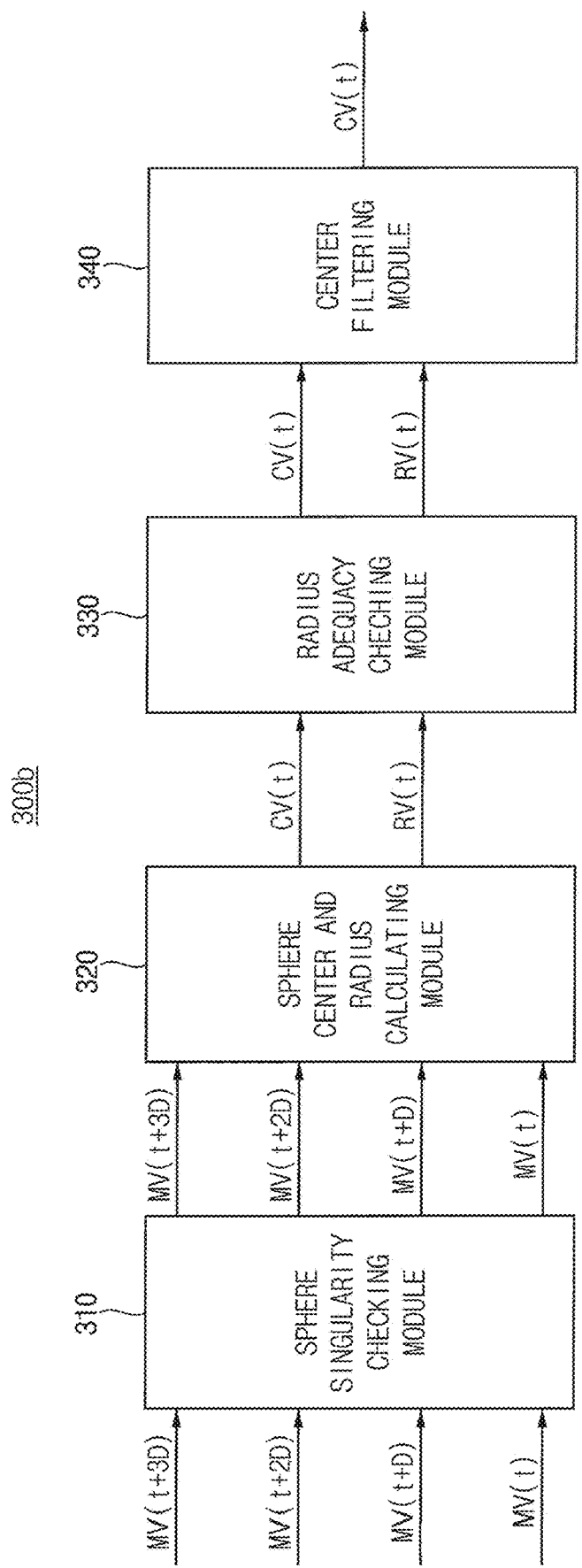
FIG. 16 is a block diagram illustrating in still another example the calculating module 300 of the magnetometer calibration device of FIG. 2.

FIG. 16 is a block diagram illustrating in another example (300b) the calculating module 300 of the magnetometer calibration device of FIG. 2.

Referring to FIGS. 2, 6, 10 and 16, the calculating module 300b may include a sphere singularity checking module 310, a sphere center and radius calculating module 320, a radius adequacy checking module 330 and a center filtering module 340.

The sphere singularity checking module 310 may perform a sphere singularity check on the measurement values MV(t+3D), MV(t+2D), MV(t+D) and MV(t) that are provided from the measurement value obtaining module 200a of FIG. 6 through the output lines OL1, OL2, OL3 and OL4. Here, the sphere singularity check may correspond to the first verification operation described in relation to FIG. 2.

The sphere center and radius calculating module 320 may be substantially the same as the sphere center and radius calculating module 320 described in relation to FIG. 10.

The radius adequacy checking module 330 may perform a radius adequacy check in accordance with the center value CV(t) and the radius value RV(t) that are output from the sphere center and radius calculating module 320. The radius adequacy check may correspond to the second verification operation described in relation to FIG. 2.

The center filtering module 340 may perform a filtering operation on the center value CV(t) that is provided by the radius adequacy checking module 330. For example, a low pass filtering may be performed on the center value CV(t). Since the input data contains noise, the output may also contain noise, and thus the center filtering module 340 may be used to smooth out the high frequency deviation. For example, a second-order low pass filter having a cut-off frequency of about 0.25 Hz may be used.

In certain embodiments of the inventive concept, when at least one of the method steps S210, S230 and S240 of FIG. 12 is omitted, at least one of the sphere singularity checking module 310, the radius adequacy checking module 330 and the center filtering module 340 of FIG. 16 may likewise be omitted.

Figure 17:
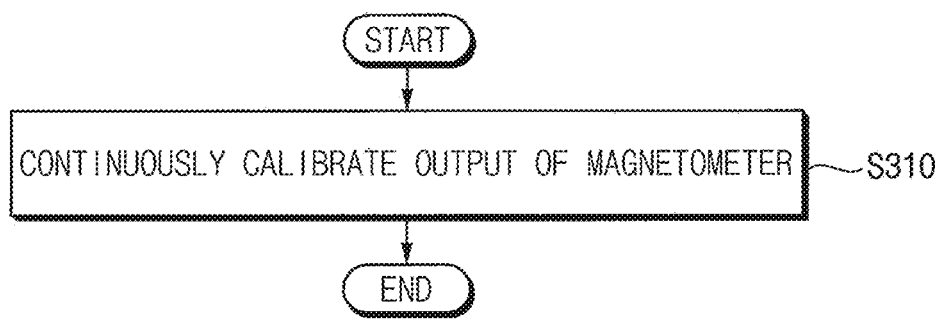
FIG. 17 is a flowchart further illustrating in one example the method step (S300) of calibrating the output of the magnetometer in FIG. 1.

FIG. 17 is a flowchart further illustrating in one example the calibrating of the output of the magnetometer (S300) of FIG. 1.

Referring to FIGS. 1 and 17, when calibrating the output of the magnetometer in accordance with the center of the sphere (S300), the output of the magnetometer may be continuously calibrated in accordance with the center of the sphere that is periodically calculated and updated (S310). For example, steps S300 and S310 may be performed by the calibrating module 400 of FIG. 2, and the calibrated measurement value CMV may be generated by calibrating the measurement values OMV in accordance with the center value CV.

Figure 18:
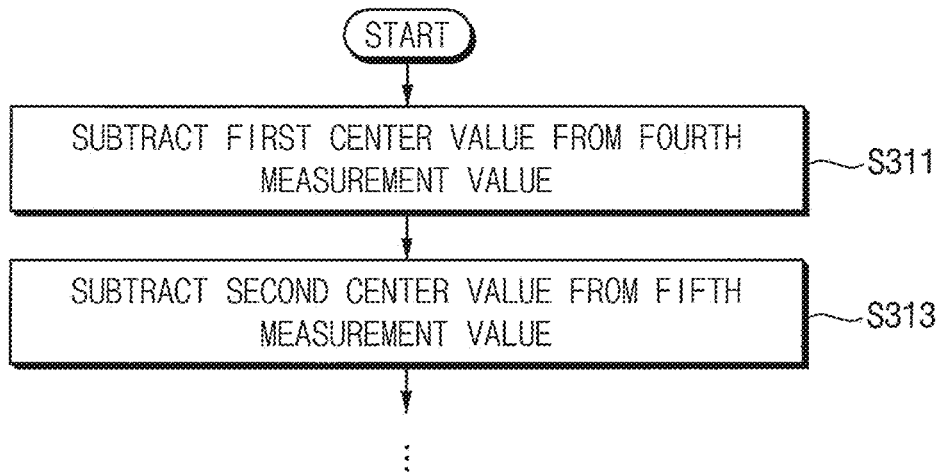
FIG. 18 is a flowchart further illustrating in one example the method step (S310) of continuously calibrating the output of the magnetometer in FIG. 17.

FIG. 18 is a flowchart further illustrating in one example the continuously calibrating of the output of the magnetometer (S310) of FIG. 17.

Referring to FIGS. 1, 9, 17 and 18, when continuously calibrating the output of the magnetometer (S310), a first calibrated measurement value may be generated by subtracting the first center value that is calculated in method step S221 of FIG. 9 from the fourth measurement value that is obtained by method step S117 of FIG. 5 (S311). For example, method step S311 may be performed at or following the fourth time point at which the fourth measurement value is obtained and the first center value is calculated.

Thereafter, a second calibrated measurement value may be generated by subtracting the second center value that calculated by method step S225 of FIG. 9 from the fifth measurement value obtained by the method step S119 of FIG. 5 (S313). For example, the method step S313 may be performed at or following the fifth time point at which the fifth measurement value is obtained and the second center value is calculated.

Although shown in FIG. 18, the calibration operation may be periodically performed following the method step S313. For example, when the sixth measurement value is obtained and the third center value is calculated at the sixth time point following the fifth time point, a third calibrated measurement value may be generated by subtracting the third center value from the sixth measurement value.

Figure 19A:
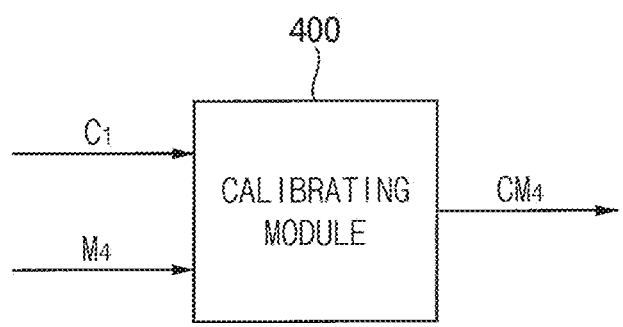
FIGS. 19A and 19B are respective diagrams further illustrating operation of the calibrating module 400 of the magnetometer calibration device of FIG. 2.
Figure 19B:
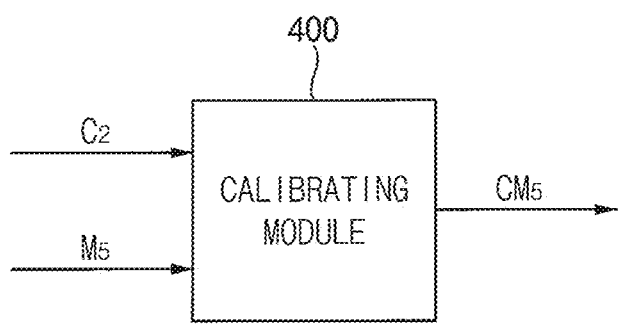

FIGS. 19A and 19B are block diagrams further illustrating operation of the calibrating module 400 included in the magnetometer calibration device of FIG. 2.

Referring to FIGS. 19A and 19B, an example is presented in which the calibrating module 400 periodically calibrates the measurement values $M_4$ and $M_5$ as described in relation to FIGS. 17 and 18.

When the fourth measurement value $M_4$ is obtained and the first center value $C_1$ is calculated at the fourth time point $t_4$ as described with reference to FIGS. 7A and 11A, a first calibrated measurement value $CM_4$ may be generated by subtracting the first center value $C_1$ from the fourth measurement value $M_4$, as illustrated in FIG. 19A.

Thereafter, when the fifth measurement value $M_5$ is obtained and the second center value $C_2$ is calculated at the fifth time point $t_5$ as described with reference to FIGS. 7B and 11B, a second calibrated measurement value $CM_2$ may be generated by subtracting the second center value $C_2$ from the fifth measurement value $M_5$, as illustrated in FIG. 19B.

However, the scop of the inventive concept is not limited thereto, and the calibrating module 400 may directly calibrate the raw measurement values MV provided from the magnetometer 20. For example, when the first center value $C_1$ is calculated, the raw measurement values MV may be calibrated using the first center value $C_1$ until the second center value $C_2$ is calculated. Similarly, when the second center value $C_2$ is calculated, the raw measurement values MV may be calibrated using the second center value $C_2$ until the third center value subsequent to the second center value $C_2$ is calculated.

As will be appreciated by those skilled in the art, the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

FIG. 20 is a block diagram illustrating an electronic device 1000 according to embodiments of the inventive concept.

Referring to FIG. 20, the electronic device 1000 may include a processor 1010, a memory 1100, an output interface (e.g., including output circuitry) 1200, a sensor 1400, a communication interface (e.g., including communication circuitry) 1500, an audio/video (A/V) input interface (e.g., including A/V input circuitry) 1600, an input interface (e.g., including input circuitry) 1700, and a magnetometer calibration device 1800.

The processor 1010 includes various processing circuitry and controls general operations of the electronic device 1000. The magnetometer calibration device 1800 may be the magnetometer calibration device according to example embodiments, may perform the method of calibrating the magnetometer according to example embodiments, and thus may calibrate a magnetometer 1410.

The input interface 1700 may receive an input for controlling an operation of a module mounted in the electronic device 1000.

The output interface 1200 may include various circuitry to output an audio signal, a video signal, and/or a vibration signal, and may include a display 1210, a sound output interface (e.g., including sound output circuitry) 1220, and a vibration motor 1230. For example, the output interface 1200 may output a notification message as an audio, a video, and/or vibration.

The processor 1010 may generally control the input interface 1700, the output interface 1200, the sensor 1400, the communication interface 1500, the A/V input interface 1600, or the like, by executing programs stored in the memory 1100. Also, the processor 1010 may perform the functions of the electronic device 1000, by executing the programs stored in the memory 1100.

The sensor 1400 may include various sensors and sensing circuitry to sense a state of the electronic device 1000, a state of a user, or a state around the electronic device 1000, and may transmit sensed information to the processor 1010. The sensor 1400 may include various sensing circuitry, such as, for example, and without limitation, at least one of the magnetometer (or magnetic field sensor) 1410, an acceleration sensor 1420, a temperature/humidity sensor 1430, an infrared sensor 1440, a gyroscope sensor 1450, a position sensor (e.g., global positioning system (GPS)) 1460, an atmospheric sensor 1470, a proximity sensor 1480, and an RGB sensor 1490, but is not limited thereto.

The communication interface 1500 may include various communication circuitry including at least one component configured to enable the electronic device 1000 to communicate with another electronic device (not illustrated) and a server (not illustrated). For example, the communication interface 1500 may include a short-range wireless communication interface 1510, a mobile communication interface 1520, and a broadcasting receiving interface 1530. The short-range wireless communication interface 1510 may include a Bluetooth communication interface, a Bluetooth low energy (BLE) communication interface, a near-field communication and/or radio frequency identification (NFC/RFID) interface, a WLAN (e.g., Wi-fi) communication interface, a Zigbee communication interface, an infrared data association (IrDA) communication interface (not illustrated), a Wi-fi direct (WFD) communication interface, a ultra wideband (UWB) communication interface, an Ant+ communication interface, or the like, but is not limited thereto.

The A/V input interface 1600 may include various A/V interface circuitry and is configured to input an audio signal or a video signal, and may include a camera 1610, a microphone 1620, or the like.

The memory 1100 may store programs for the processing and controlling operations of the processor 1010, and may store data that is input to the electronic device 1000 or output from the electronic device 1000. The programs stored in the memory 1100 may be divided into a plurality of modules in accordance with their functions. For example, the programs may be divided into a user interface (UI) module 1110, a touch screen module 1120, and a notification module 1130.

Figure 21A:
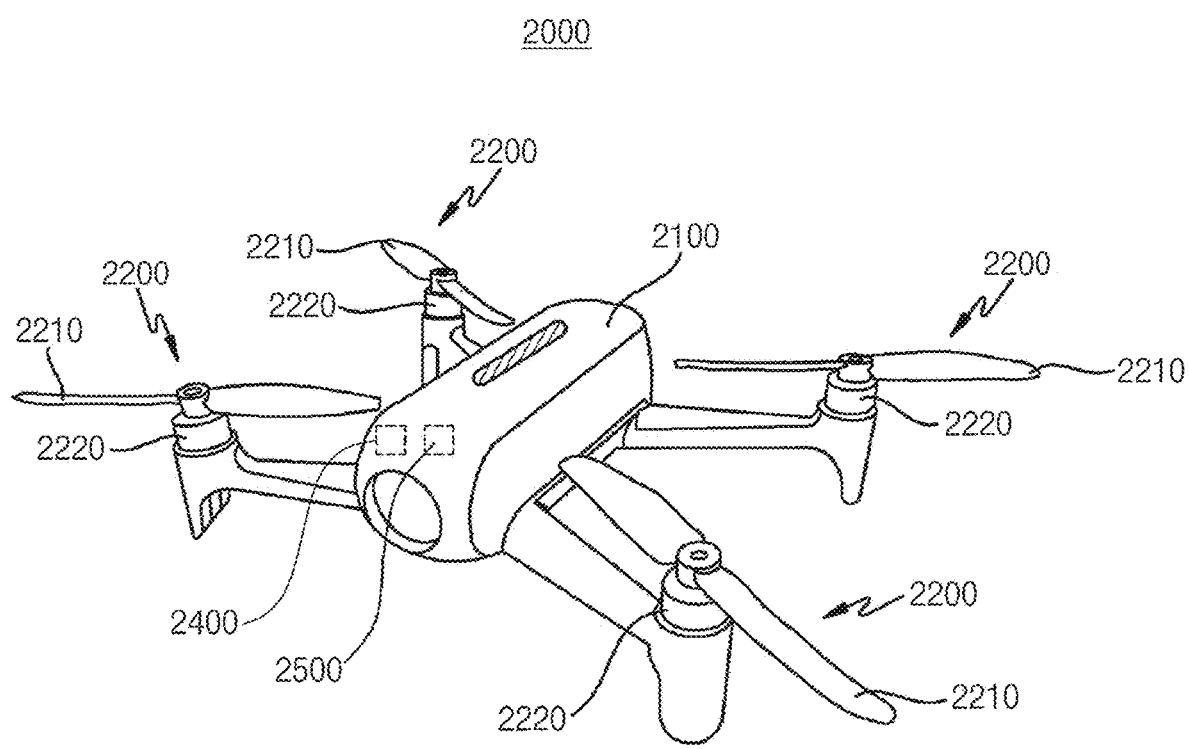
FIGS. 21A and 21B are perspective diagrams illustrating possible examples of the electronic device of FIG. 20.
Figure 21B:
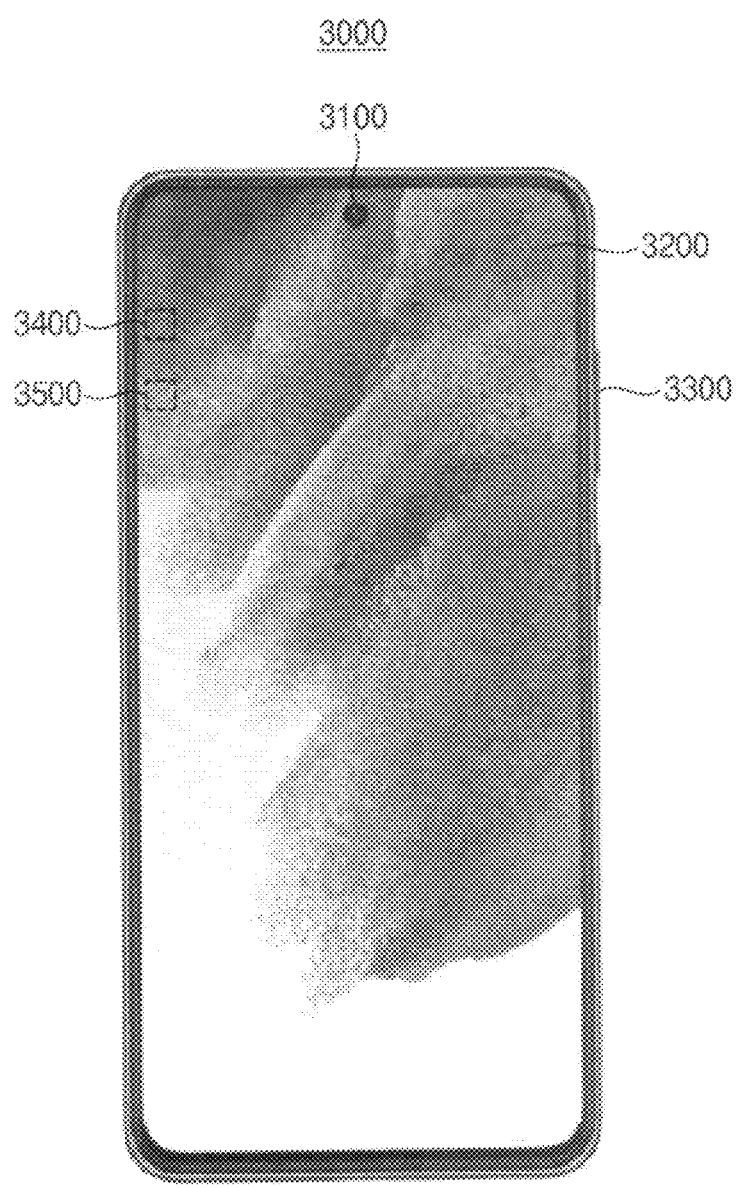

FIGS. 21A and 21B are respective diagrams illustrating various application implementations for the electronic device of FIG. 20.

Referring to FIG. 21A, the electronic device 1000 may be implemented in the form of an unmanned aerial vehicle (UAV) 2000 and/or a control system that controls the unmanned aerial vehicle 2000.

The unmanned aerial vehicle 2000 may include a housing 2100, a plurality of propulsion elements 2200, a magnetometer 2400 and a magnetometer calibration device 2500. The plurality of propulsion elements 2200 may provide a thrust to the unmanned aerial vehicle 2000, and may enable the unmanned aerial vehicle 2000 to fly. For example, each of the plurality of propulsion elements 2200 may include a propeller 2210 and a motor 2220 configured to rotate the propeller 2210. The magnetometer 2400 and the magnetometer calibration device 2500 may be disposed or located inside the housing 2100.

Referring to FIG. 21B, the electronic device 1000 may be implemented in the form of a smart phone 3000.

The smart phone 3000 may include a camera 3100, a display and touch screen 3200, at least one physical button 3300, a magnetometer 3400 and a magnetometer calibration device 3500.

FIGS. 22A, 22B, 22C, 22D and 22E are respective diagrams illustrating performance examples for methods of calibrating a magnetometer and operation of a magnetometer calibration device according to embodiments of the inventive concept.

Figure 22A:
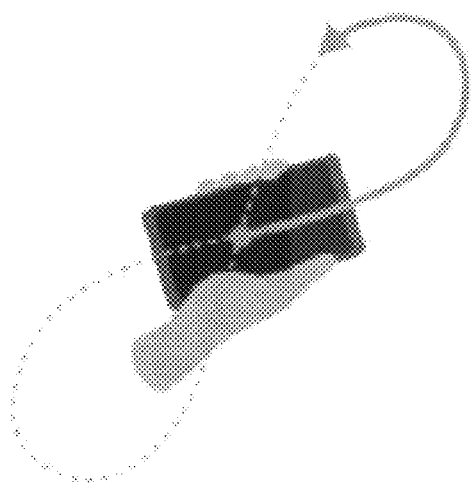
FIGS. 22A, 22B, 22C, 22D and 22E are respective diagrams further illustrating performance of a method of calibrating a magnetometer and operation of a magnetometer calibration device according to embodiments of the inventive concept.

Referring to FIG. 22A, a calibration operation for a smart phone recommended, for example, by the Google Maps Android application is illustrated in part. For example, a magnetometer calibration may be performed by rotating the smart phone as illustrated.

Figure 22B:
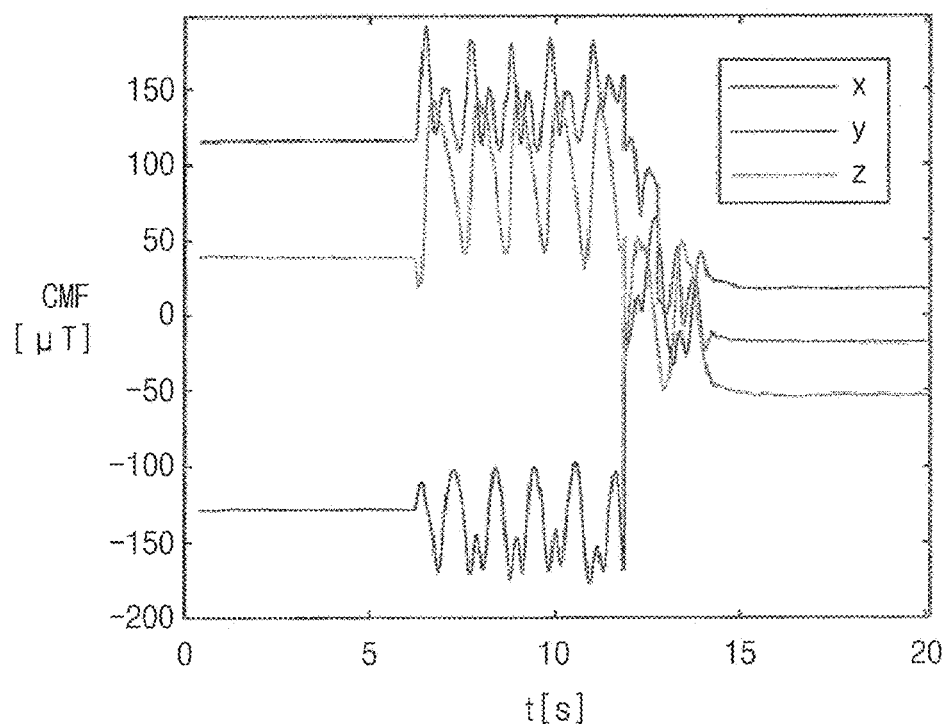
Figure 22C:
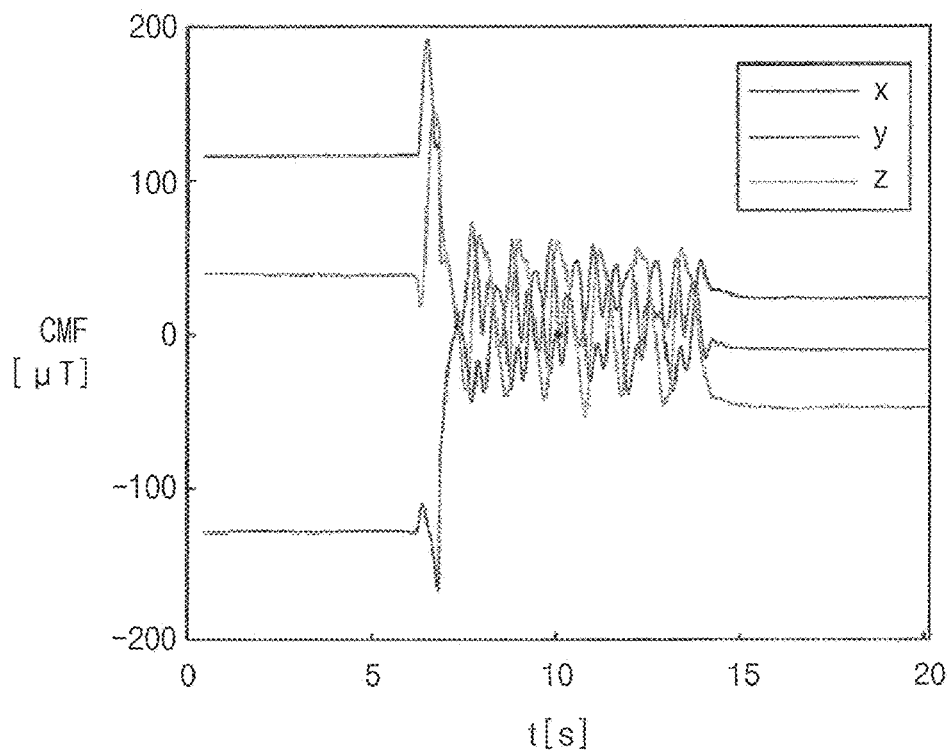

FIGS. 22B and 22C illustrate the performance of the calibration operation when the magnetometer calibration is performed by rotating the smart phone illustrated in FIG. 22A. FIG. 22B represents a conventional algorithm, and FIG. 22C represents an algorithm in accordance with the method calibrating the magnetometer according to example embodiments. Here, it can be seen that the magnetometer is calibrated accurately, faster and efficiently in accordance with the algorithm according to example embodiments.

Figure 22D:
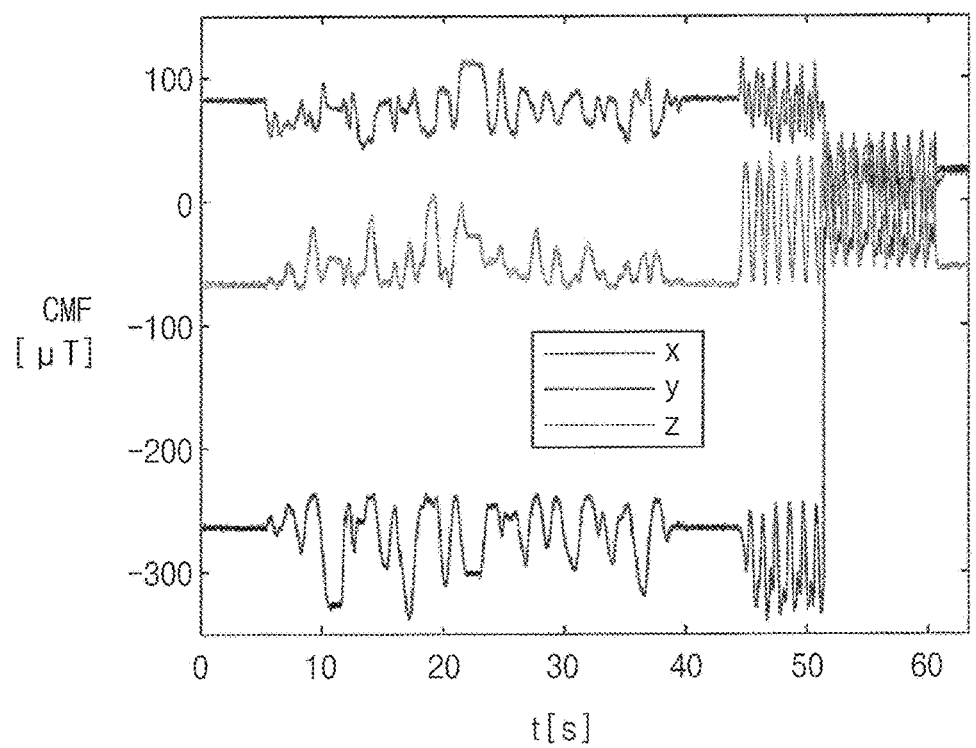
Figure 22E:
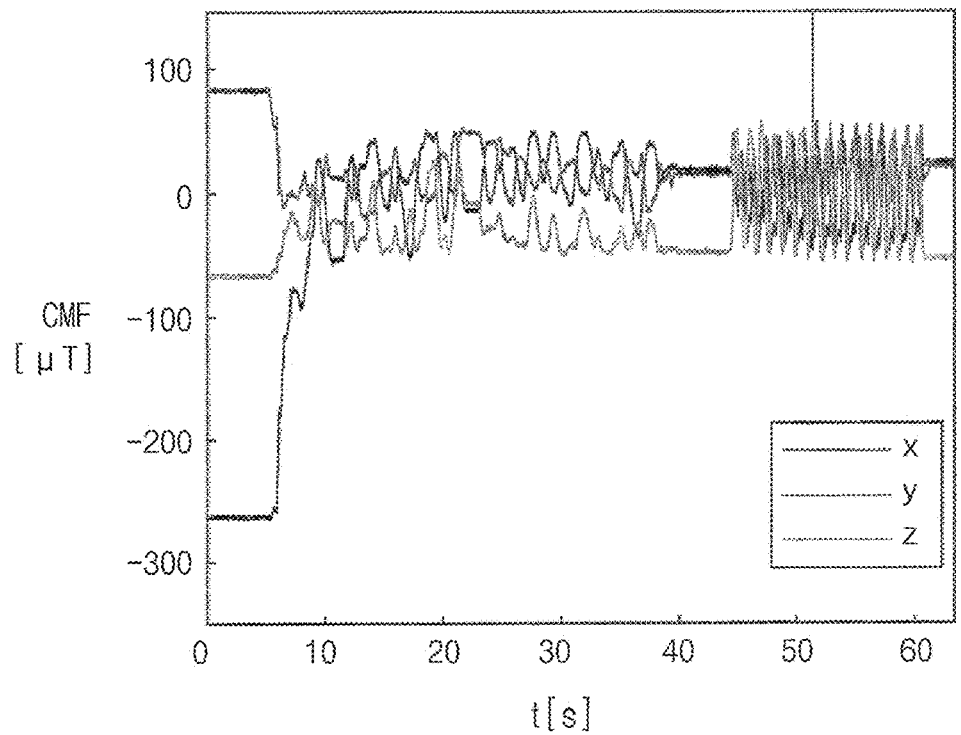

FIGS. 22D and 22E illustrate the performance of the calibration operation when the smart phone is rotated slowly and shallowly for about 40 seconds and then the smart phone is rotated rapidly after that. FIG. 22D represents a conventional algorithm, and FIG. 22E represents an algorithm in accordance with the method calibrating the magnetometer according to example embodiments. While the conventional algorithm ignores the slow motion and is performed only afterward, the algorithm according to example embodiments is performed even on the slow motion. Thus, it can be seen that the magnetometer is calibrated accurately, faster and efficiently in accordance with the algorithm according to example embodiments.

Different embodiments of the inventive concept may be variously applied to electronic devices and systems including one or more magnetometer(s). For example, other embodiments of the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of calibrating a magnetometer, the method comprising:
    obtaining at least four measurement values using the magnetometer;
    calculating a center and a radius of a sphere in accordance with the measurement values, wherein the center and the radius of the sphere correspond to an internal magnetic field associated with an electronic device including the magnetometer; and
    calibrating an output of the magnetometer in accordance with the center of the sphere.

2. The method of claim 1, wherein the obtaining of the at least four measurement values using the magnetometer comprises periodically obtaining the at least four measurement values using the magnetometer,
    the calculating of the center and the radius of the sphere in accordance with the measurement values comprises periodically calculating and updating the center and the radius of the sphere in accordance with the measurement values, as periodically obtained, and
    the calibrating of the output of the magnetometer comprises continuously calibrating the output of the magnetometer in accordance with the center of the sphere, as periodically calculated and updated.

3. The method of claim 2, wherein the periodically obtaining of the at least four measurement values using the magnetometer comprises:
    obtaining a first measurement value at a first time point;
    obtaining a second measurement value at a second time point following the first time point;
    obtaining a third measurement value at a third time point following the second time point; and
    obtaining a fourth measurement value at a fourth time point following the third time point.

4. The method of claim 3, wherein a first center value corresponding to the center of the sphere is calculated using the first measurement value, the second measurement value, the third measurement value and the fourth measurement value.

5. The method of claim 3, wherein a first time interval between the first time point and the second time point, a second time interval between the second time point and the third time point, and a third time interval between the third time point and the fourth time point are equal to each other.

6. The method of claim 3, further comprising:
    obtaining a fifth measurement value at a fifth time point following the fourth time point.

7. The method of claim 6, wherein a second center value corresponding to the center of the sphere is calculated using the second measurement value, the third measurement value, the fourth measurement value and the fifth measurement value.

8. The method of claim 3, wherein the periodically calculating and updating of the center and the radius of the sphere in accordance with the measurement values, as periodically obtained, comprises:
    calculating a first center value corresponding to the center of the sphere in accordance with the first measurement value, the second measurement value, the third measurement value and the fourth measurement value; and calculating a first radius value corresponding to the radius of the sphere in accordance with the first center value and at least one of the first measurement value, the second measurement value, the third measurement value and the fourth measurement value.

9. The method of claim 8, wherein the periodically calculating and updating of the center and the radius of the sphere in accordance with the measurement values, as periodically obtained, further comprises:
performing a sphere singularity check in accordance with the first measurement value, the second measurement value, the third measurement value and the fourth measurement value.

10. The method of claim 9, wherein the performing of the sphere singularity check comprises:
performing a proximity check on the first measurement value, the second measurement value, the third measurement value and the fourth measurement value.

11. The method of claim 9, wherein the performing of the sphere singularity check comprises:
performing a coplanarity check on the first measurement value, the second measurement value, the third measurement value and the fourth measurement value.

12. The method of claim 8, wherein the periodically calculating and updating of the center and the radius of the sphere in accordance with the measurement values, as periodically obtained, further comprises:
performing a radius adequacy check in accordance with the first center value and the first radius value.

13. The method of claim 12, wherein performing of the radius adequacy check comprises:
checking whether the first radius value falls within a predetermined reference range.

14. The method of claim 12, wherein the performing of the radius adequacy check comprises:
checking whether an amplitude associated with the first center value falls within a predetermined reference range.

15. The method of claim 8, wherein the periodically calculating and updating of the center and the radius of the sphere in accordance with the measurement values, as periodically obtained, further comprises:
performing a filtering operation on the first center value.

16. The method of claim 3, wherein the periodically obtaining of the at least four measurement values using the magnetometer further comprises:
calculating a second center value corresponding to the center of the sphere in accordance with the second measurement value, the third measurement value, the fourth measurement value and a fifth measurement value obtained at a fifth time point following the fourth time point; and
calculating a second radius value corresponding to the radius of the sphere in accordance with the second center value and at least one of the second measurement value, the third measurement value, the fourth measurement value and the fifth measurement value.

17. The method of claim 1, wherein the calibrating of the output of the magnetometer comprises:
subtracting a first center value from a first measurement value among the at least four measurement values, wherein the first center value corresponds to the center of the sphere.

18. A magnetometer calibration device comprising:
a measurement value obtaining module connected to a magnetometer and configured to obtain at least four measurement values;
a calculating module configured to calculate a center and a radius of a sphere in accordance with the at least four measurement values, wherein the center and the radius of the sphere correspond to an internal magnetic field associated with an electronic device including the magnetometer; and
a calibrating module configured to calibrate an output of the magnetometer in accordance with the center of the sphere.

19. The magnetometer calibration device of claim 18, wherein the calculating module comprises:
a sphere singularity checking module configured to perform a sphere singularity check in accordance with a first measurement value, a second measurement value, a third measured measurement and a fourth measurement value among the at least four measurement values;
a sphere center and radius calculating module configured to calculate a first center value corresponding to the center of the sphere and a first radius value corresponding to the radius of the sphere in accordance with the first measurement value, the second measurement value, the third measurement value and the fourth measurement value;
a radius adequacy checking module configured to perform a radius adequacy check in accordance with the first center value and the first radius value; and
a center filtering module configured to perform a filtering operation on the first center value.

20. A method of calibrating a magnetometer, the method comprising:
periodically obtaining at least four measurement values using the magnetometer;
periodically calculating a center and a radius of a sphere in accordance with the at least four measurement values; and
continuously calibrating an output of the magnetometer in accordance with the center of the sphere,
wherein the periodically obtaining of the at least four measurement values includes sequentially obtaining a first measurement value, a second measurement value, a third measurement value and a fourth measurement value,
the periodically calculating of the center and the radius of the sphere includes:
performing a sphere singularity check including at least one of a proximity check and a coplanarity check on the first measurement value, the second measurement value, the third measurement value and the fourth measurement value;
calculating a first center value corresponding to the center of the sphere and a first radius value corresponding to the radius of the sphere in accordance with the first measurement value, the second measurement value, the third measurement value and the fourth measurement value;
performing a radius adequacy check including at least one of an operation of checking whether the first radius value falls within a first reference range and an operation of checking whether an amplitude associated with the first center value falls within a second reference range; and
performing a filtering operation on the first center value, and the continuously calibrating of the output of the magnetometer includes subtracting the first center value from the fourth measurement value.

* * * * *